(12) United States Patent
Chiu

(10) Patent No.: US 12,394,709 B2
(45) Date of Patent: Aug. 19, 2025

(54) METHOD FOR FABRICATING SEMICONDUCTOR DEVICE WITH FUSE STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 545 days.

(21) Appl. No.: 17/840,097

(22) Filed: Jun. 14, 2022

(65) Prior Publication Data

US 2023/0402371 A1  Dec. 14, 2023

(51) Int. Cl.
*H01H 85/02* (2006.01)
*H01H 69/02* (2006.01)
*H01L 23/525* (2006.01)

(52) U.S. Cl.
CPC ......... *H01L 23/5256* (2013.01); *H01H 69/02* (2013.01); *H01H 85/0241* (2013.01); *H01H 2085/0283* (2013.01)

(58) Field of Classification Search
CPC ................ H01L 23/5256; H01H 69/02; H01H 85/0241; H01H 2085/0283; H01H 69/022
See application file for complete search history.

(56) References Cited

U.S. PATENT DOCUMENTS

| | | | |
|---|---|---|---|
| 8,026,574 B2 | 9/2011 | Kurjanowicz et al. | |
| 8,278,155 B2 | 10/2012 | Burr et al. | |
| 9,754,875 B1 | 9/2017 | Fogel et al. | |
| 2007/0273002 A1* | 11/2007 | Hwang | H01L 23/5256 257/E23.149 |
| 2017/0345829 A1* | 11/2017 | Balakrishnan | H01L 29/42392 |
| 2018/0019206 A1* | 1/2018 | Nagai | H01L 23/5283 |
| 2018/0025982 A1* | 1/2018 | Hall | H10B 20/25 257/529 |
| 2018/0061759 A1* | 3/2018 | Li | H10D 84/038 |
| 2020/0212049 A1 | 7/2020 | Lin | |

FOREIGN PATENT DOCUMENTS

TW  202025453 A  7/2020
TW  202221717 A  6/2022

* cited by examiner

*Primary Examiner* — Moazzam Hossain
(74) *Attorney, Agent, or Firm* — MUNCY, GEISSLER, OLDS & LOWE, P.C.

(57) ABSTRACT

A method for fabricating a semiconductor device is provided. The method includes providing a substrate; forming a fuse element within the substrate and extending from an upper surface of the substrate; and forming a fuse medium in contact with the fuse element, wherein the fuse medium is spaced apart from the upper surface of the substrate.

8 Claims, 28 Drawing Sheets

METHOD FOR FABRICATING SEMICONDUCTOR DEVICE WITH FUSE STRUCTURE

TECHNICAL FIELD

The present disclosure relates to a method for fabricating a semiconductor device, and more particularly, to a method for fabricating a semiconductor device including a fuse structure embedded in a substrate.

DISCUSSION OF THE BACKGROUND

Many integrated circuits (ICs) are made up of millions of interconnected devices, such as transistors, resistors, capacitors, and diodes, on a single chip of a semiconductor substrate. It is generally desirable that ICs operate as fast as possible, and consume as little power as possible. Semiconductor ICs often include one or more types of memory, such as complementary metal-oxide-semiconductor (CMOS) memory, antifuse memory, and efuse memory.

EFuses are usually integrated into semiconductor ICs by a semiconductor material (e.g., a polysilicon) disposed on a dielectric layer (e.g., silicon oxide). A programing current is applied to blow out the dielectric layer, thus changing the resistivity of the eFuse. This is referred to as "programming" the eFuse. However, such structure requires a relatively large breakdown voltage, which may adversely affect the performance of a semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a fuse element, and a fuse medium. The fuse element is disposed within the substrate. The fuse medium surrounds a lateral surface of the fuse element.

Another aspect of the present disclosure provides a semiconductor device. The semiconductor device includes a substrate, a fuse element, and a fuse medium. The fuse element is disposed within the substrate and extends from an upper surface of the substrate. The fuse medium is in contact with the fuse element. The fuse medium is spaced apart from the upper surface of the substrate.

Another aspect of the present disclosure provides a method of manufacturing a semiconductor device. The method includes providing a substrate. The method also includes forming a fuse element within the substrate. The method further includes forming a fuse medium within the substrate, wherein the fuse medium surrounds the fuse element.

The embodiments of the present disclosure provide a fuse structure. The fuse structure may be embedded in a substrate. The fuse structure may include a fuse element and a fuse medium. The fuse medium is made of a semiconductor material with dopants. The fuse structure may have a relatively small breakdown voltage.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
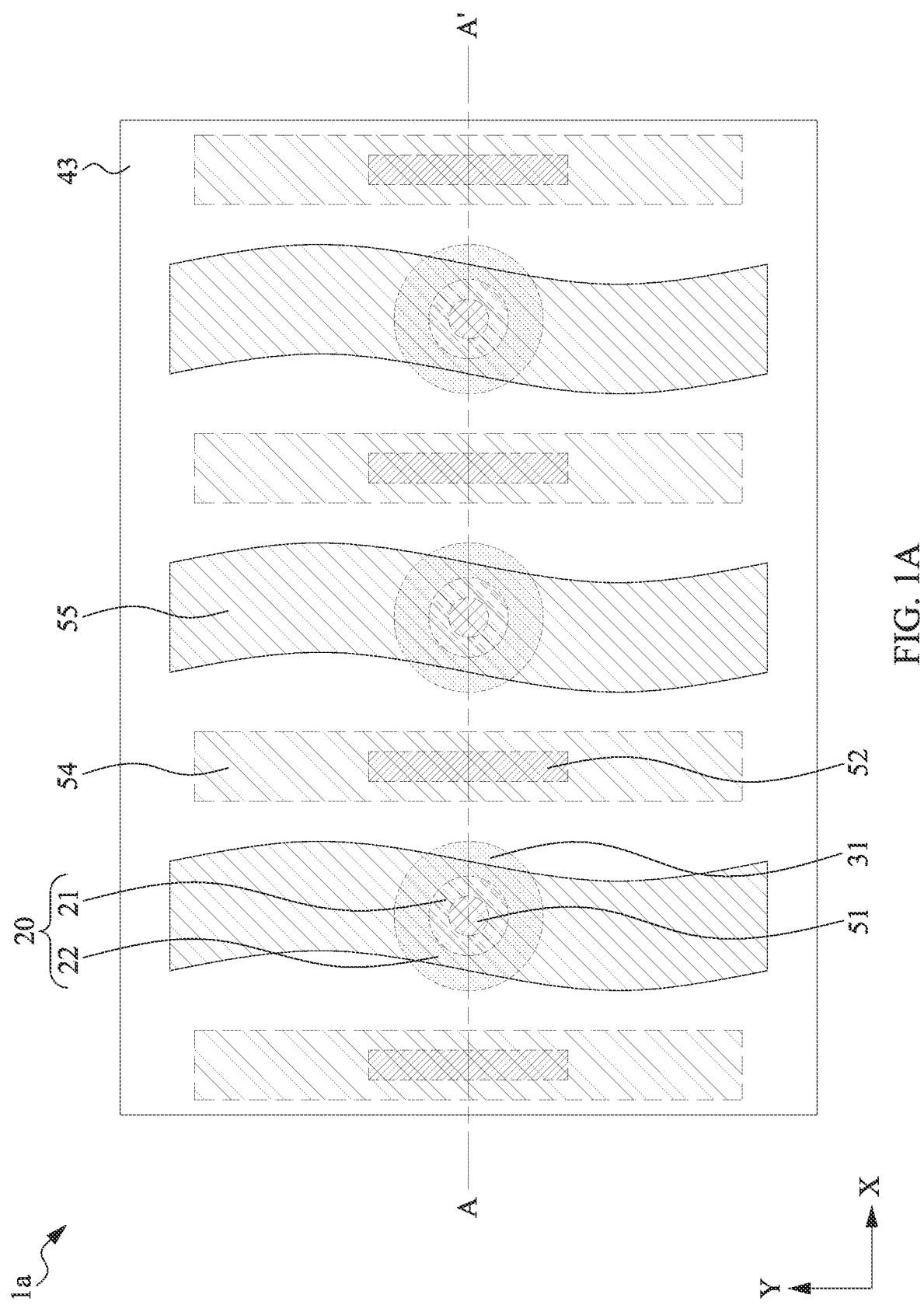
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Figure 1B:
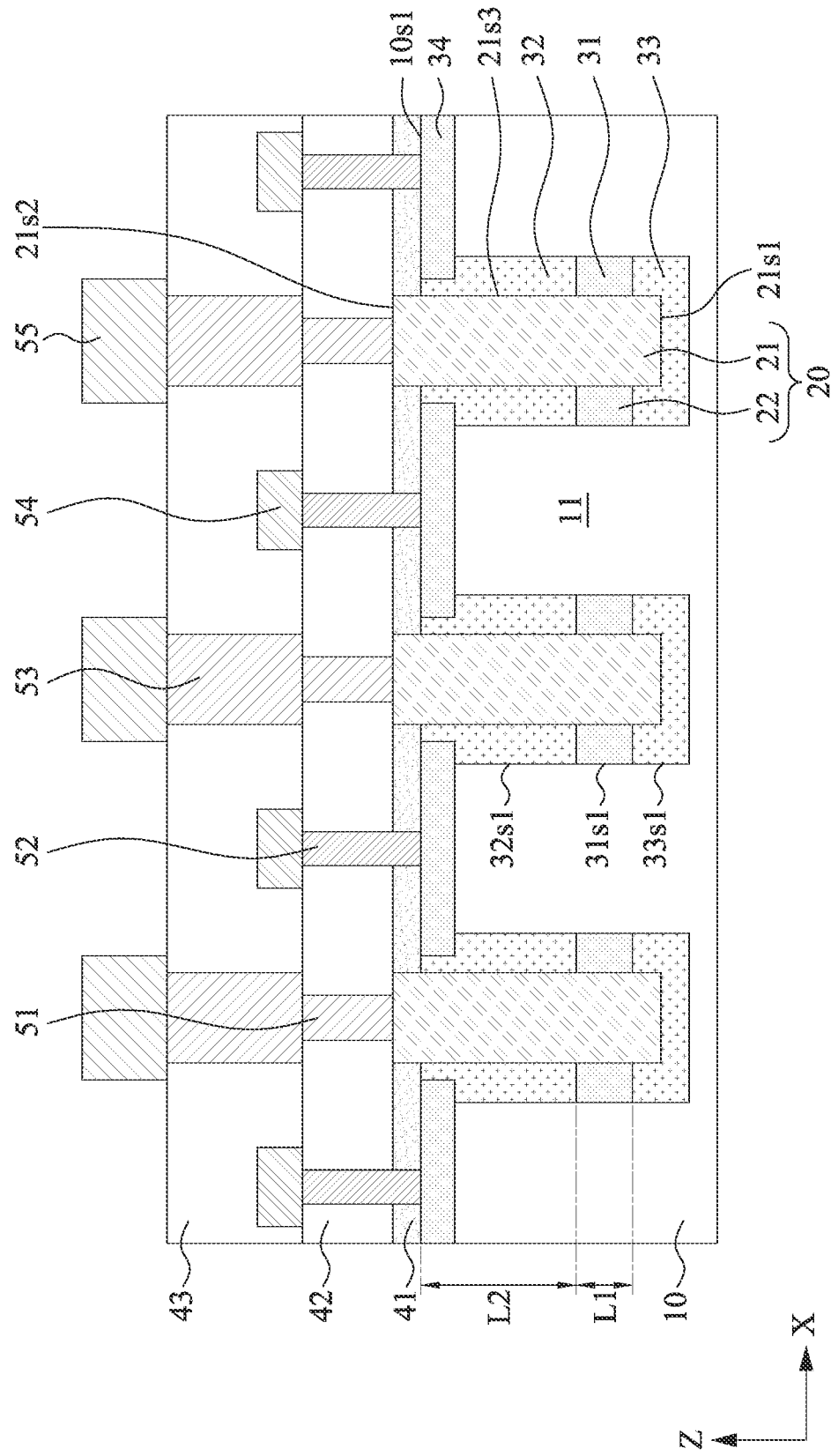
FIG. 1B is a cross-sectional view along line A-A' of the semiconductor device as shown in FIG. 1A, in accordance with some embodiments of the present disclosure.

FIG. 1A and FIG. 1B illustrate a semiconductor device 1$a$, in accordance with some embodiments of the present disclosure. FIG. 1A is a top view, and FIG. 1B is a cross-sectional view along line A-A' of FIG. 1A. In some embodiments, the semiconductor device 1$a$ may include, for example, a memory device or other suitable devices. The memory device may include, for example, a one-time programming (OTP) memory device, a dynamic random access memory (DRAM) device, a static random access memory (SRAM) device, or other suitable memory devices.

In some embodiments, the semiconductor device 1$a$ may include a substrate 10, a fuse structure 20, doped regions 31, 32, 33, and 34, dielectric layers 41, 42, and 43, as well as conductive features 51, 52, 53, 54, and 55.

The substrate 10 may be a semiconductor substrate, such as a bulk semiconductor, a semiconductor-on-insulator (SOI) substrate, or the like. The substrate 10 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 10 may have a multilayer structure, or the substrate 10 may include a multilayer compound semiconductor structure. The substrate 10 may have a surface 10$s$1. The surface 10$s$1 may also be referred to as an upper surface.

The substrate 10 may include a well region 11. The well region 11 may be located within the substrate 10. In some embodiments, the well region 11 may include a first conductive type. In some embodiments, the first conductive type is a p-type. In some embodiments, p-type dopants include boron (B), other group III elements, or any combination thereof. In some embodiments, the first conductive type is an n-type. In some embodiments, n-type dopants include arsenic (As), phosphorus (P), other group V elements, or any combination thereof.

In some embodiments, the fuse structure 20 may be disposed within the substrate 10. In some embodiments, a portion of the fuse structure 20 may be embedded in the substrate 10. In some embodiments, a portion of the fuse structure 20 may protrude from the surface 10s1 of the substrate 10. In some embodiments, the fuse structure 20 may include a circular profile, an elliptical profile, or other suitable profiles from a top view. In some embodiments, the fuse structure 20 may have a fuse element 21 and a fuse medium 22.

In some embodiments, the fuse element 21 may be disposed within the substrate 10. In some embodiments, a portion of the fuse element 21 may be embedded in the substrate 10. In some embodiments, a portion of the fuse element 21 may protrude from the surface 10s1 of the substrate 10. The fuse element 21 may have a surface 21s1, a surface 21s2 opposite to the surface 21s1, and a surface 21s3 extending the surfaces 21s1 and 21s2. The surface 21s1 may also be referred to as a lower surface. The surface 21s2 may also be referred to as an upper surface. The surface 21s3 may also be referred to as a lateral surface. In some embodiments, the surface 21s2 of the fuse element 21 and the surface 10s1 of the substrate 10 may be located at different horizontal levels. In some embodiments, the surface 21s2 of the fuse element 21 may be located at a horizontal level higher than that of the surface 10s1 of the substrate 10.

In some embodiments, the fuse element 21 may include a semiconductor material, such as polysilicon, silicon-germanium, and/or other suitable materials. In some embodiments, the fuse element 21 may include dopants with a second conductive type different from the first conductive type.

In some embodiments, the fuse element 21 may include a circular profile, an elliptical profile, or other suitable profiles from a top view.

In some embodiments, the fuse medium 22 may be disposed within the substrate 10. In some embodiments, the fuse medium 22 may be spaced apart from the surface 10s1 of the substrate 10. In some embodiments, the fuse medium 22 may surround the fuse element 21. In some embodiments, the fuse medium 22 may surround the surface 21s3 of the fuse element 21. In some embodiments, the fuse medium 22 may be in contact with the fuse element 21. In some embodiments, the fuse medium 22 may be in contact with the surface 21s3 of the fuse element 21. In some embodiments, the fuse medium 22 may be spaced apart from the surface 21s1 of the fuse element 21. In some embodiments, the fuse medium 22 may be spaced apart from the surface 21s2 of the fuse element 21.

In some embodiments, the doped region 31 may be disposed within the substrate 10. In some embodiments, the doped region 31 may have the first conductive type. In some embodiments, the doped region 31 may have a relatively large dopant concentration. For example, the dopant concentration of the doped region 31 may be on the order of $10^{20}$ dopant ions/cm$^3$.

In some embodiments, the doped region 31 may function as the fuse medium 22. In some embodiments, the doped region 31 may be spaced apart from the surface 10s1 of the substrate 10. In some embodiments, the doped region 31 may surround the fuse element 21. In some embodiments, the doped region 31 may surround the surface 21s3 of the fuse element 21. In some embodiments, the doped region 31 may be in contact with the fuse element 21. In some embodiments, the doped region 31 may be in contact with the surface 21s3 of the fuse element 21. In some embodiments, the doped region 31 may be spaced apart from the surface 21s1 of the fuse element 21. In some embodiments, the doped region 31 may be spaced apart from the surface 21s2 of the fuse element 21. In some embodiments, the doped region 31 may include a circular profile, an elliptical profile, or other suitable profiles from a top view.

In some embodiments, the doped region 32 may be disposed within the substrate 10. In some embodiments, the doped region 32 may have the first conductive type. In some embodiments, the doped region 32 may have a relatively small dopant concentration. For example, the dopant concentration of the doped region 32 may range from about $10^{18}$ dopant ions/cm$^3$ to about $10^{19}$ dopant ions/cm$^3$.

In some embodiments, the doped region 32 may be disposed over the doped region 31. In some embodiments, the doped region 32 may extend from the surface 10s1 of the doped region 31. The doped region 32 may be in contact with the surface 10s1 of the substrate 10. In some embodiments, the doped region 31 may be spaced apart from the surface 10s1 of the substrate 10 by the doped region 32. In some embodiments, the doped region 32 may surround the fuse element 21. In some embodiments, the doped region 32 may surround the surface 21s3 of the fuse element 21. In some embodiments, the doped region 32 may be in contact with the fuse element 21. In some embodiments, the doped region 32 may be in contact with the surface 21s3 of the fuse element 21. In some embodiments, the doped region 32 may be spaced apart from the surface 21s1 of the fuse element 21. In some embodiments, the doped region 32 may be spaced apart from the surface 21s2 of the fuse element 21. In some embodiments, the doped region 32 may include a circular profile, an elliptical profile, or other suitable profiles from a top view.

In some embodiments, the doped region 33 may be disposed within the substrate 10. In some embodiments, the doped region 33 may have the first conductive type. In some embodiments, the doped region 33 may have a relatively small dopant concentration. For example, the dopant concentration of the doped region 33 may range from about $10^{18}$ dopant ions/cm$^3$ to about $10^{19}$ dopant ions/cm$^3$.

In some embodiments, the doped region 33 may be disposed below the doped region 31. In some embodiments, the doped region 33 may surround the fuse element 21. In some embodiments, the doped region 33 may surround the surface 21s3 of the fuse element 21. In some embodiments, the doped region 33 may be in contact with the fuse element 21. In some embodiments, the doped region 33 may be in contact with the surface 21s3 of the fuse element 21. In some embodiments, the doped region 33 may be in contact with the surface 21s1 of the fuse element 21. In some embodiments, the doped region 33 may cover the corner, defined by the surfaces 21s1 and 21s3, of the fuse element 21. In some embodiments, the doped region 33 may include a circular profile, an elliptical profile, or other suitable profiles from a top view.

A boundary 31s1 may be located between the doped region 31 and the well region 11. A boundary 32s1 may be located between the doped region 32 and the well region 11. A boundary 33s1 may be located between the doped region 33 and the well region 11. In some embodiments, the boundary 31s1 may be substantially coplanar with the boundary 32s1. In some embodiments, the boundary 31s1 may be substantially coplanar with the boundary 33s1. In some embodiments, the boundary 32s1 may be substantially coplanar with the boundary 33s1. In some embodiments, the boundaries 31s1 and 32s1 may be substantially continuous. In some embodiments, the boundaries 31s1 and 33s1 may be substantially continuous. The doped region 31 may have a length L1 along the Z-axis. The doped region 32 may have a length L2 along the Z-axis. In some embodiments, the length L2 may be greater than the length L1.

The doped regions 31 and 33 may be configured to define an area (or a boundary) of a fuse medium (e.g., doped region 32). The doped region 33 may be configured to reduce the signal noise when the fuse structure 20 is blown out.

In some embodiments, the doped region 34 may be disposed within the substrate 10. In some embodiments, the doped region 34 may have the first conductive type. In some embodiments, the doped region 32 may have a relatively large dopant concentration. For example, the dopant concentration of the doped region 34 may be on the order of $10^{20}$ dopant ions/cm$^3$.

In some embodiments, the doped region 34 may be disposed over the doped region 31. In some embodiments, the doped region 34 may extend from the surface 10s1 of the doped region 31. In some embodiments, the doped region 34 may be spaced apart from the fuse structure 20. In some embodiments, the doped region 34 may be spaced apart from the fuse element 21. In some embodiments, the doped region 34 may be spaced apart from the doped region 31. In some embodiments, the doped region 34 may be in contact with the doped region 32. In some embodiments, the doped region 34 may be spaced apart from the doped region 33. In some embodiments, the doped region 34 may vertically overlap the doped region 31. In some embodiments, the doped region 34 may vertically overlap the doped region 32. In some embodiments, the doped region 34 may vertically overlap the doped region 33. In some embodiments, the doped region 34 may have a rectangular profile, a square profile, or other suitable profiles from a top view.

In some embodiments, the dielectric layer 41 may be disposed on the surface 10s1 of the substrate 10. In some embodiments, the dielectric layer 41 may be disposed on the doped region 34 of the substrate 10. In some embodiments, the fuse element 21 may be exposed by the fuse element 21. In some embodiments, the dielectric layer 41 may include silicon oxide, silicon nitride, silicon oxynitride, other dielectric materials, or a combination thereof. In some embodiments, the dielectric layer 41 may include a multilayered structure that includes an interfacial layer and a high-k (dielectric constant greater than 4) dielectric layer. The interfacial layer can include dielectric material such as silicon oxide, silicon nitride, silicon oxynitride, other dielectric materials, or a combination thereof. The high-k dielectric layer can include high-k dielectric material such as HfO$_2$, HfSiO, HfSiON, HfTaO, HfTiO, HfZrO, other suitable high-k dielectric materials, or a combination thereof.

In some embodiments, the dielectric layer 42 may be disposed on the surface 10s1 of the substrate 10. In some embodiments, the dielectric layer 42 may be disposed on the dielectric layer 41. In some embodiments, the dielectric layer 42 may cover a portion of the fuse structure 20. In some embodiments, the dielectric layer 42 may cover a portion of the fuse element 21. In some embodiments, the dielectric layer 42 may cover a portion of the dielectric layer 41. The dielectric layer 42 may include silicon oxide, carbon-containing oxide such as silicon oxycarbide (SiOC), silicate glass, tetraethylorthosilicate (TEOS) oxide, undoped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials.

In some embodiments, the dielectric layer 43 may be disposed on the surface 10s1 of the substrate 10. In some embodiments, the dielectric layer 43 may be disposed on the dielectric layer 42. In some embodiments, the dielectric layer 43 may cover a portion of the fuse element 21. The dielectric layer 43 may include silicon oxide, carbon-containing oxide such as silicon oxycarbide, silicate glass, tetraethylorthosilicate oxide, undoped silicate glass, or doped silicon oxide such as borophosphosilicate glass, fluorine-doped silica glass, phosphosilicate glass, boron doped silicon glass, combinations thereof and/or other suitable dielectric materials.

In some embodiments, the conductive feature 51 may be disposed on the fuse structure 20. In some embodiments, the conductive feature 51 may be disposed on the fuse element 21. In some embodiments, the conductive feature 51 may be configured to electrically connect the fuse element 21. In some embodiments, the conductive feature 51 may be embedded in the dielectric layer 41. In some embodiments, the conductive feature 51 may include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

In some embodiments, the conductive feature 52 may be disposed on the surface 10s1 of the substrate 10. In some embodiments, the conductive feature 52 may be disposed on the doped region 34. In some embodiments, the conductive feature 52 may be configured to electrically connect the doped region 34. In some embodiments, the conductive feature 52 may be embedded in the dielectric layer 41. The material of the conductive feature 52 may be the same as or similar to that of the conductive feature 51.

In some embodiments, the conductive feature 53 may be disposed on the fuse structure 20. In some embodiments, the conductive feature 53 may be disposed on the fuse element 21. In some embodiments, the conductive feature 53 may be disposed on the dielectric layer 42. In some embodiments, the conductive feature 53 may be disposed on the conductive feature 51. In some embodiments, the conductive feature 53 may be configured to electrically connect the fuse element 21 and the conductive feature 51. In some embodiments, the conductive feature 53 may be embedded in the dielectric layer 43. The material of the conductive feature 53 may be the same as or similar to that of the conductive feature 51.

In some embodiments, the conductive feature 54 may be disposed on the surface 10s1 of the substrate 10. In some embodiments, the conductive feature 54 may be disposed on the doped region 34. In some embodiments, the conductive feature 54 may be disposed on the dielectric layer 42. In some embodiments, the conductive feature 54 may be disposed on the conductive feature 52. In some embodiments, the conductive feature 54 may be configured to electrically connect the doped region 34 and the conductive feature 52. In some embodiments, the conductive feature 52 may be embedded in the dielectric layer 43. The material of the conductive feature 54 may be the same as or similar to that of the conductive feature 51.

In some embodiments, the conductive feature 55 may be disposed on the fuse structure 20. In some embodiments, the conductive feature 55 may be disposed on the fuse element 21. In some embodiments, the conductive feature 55 may be disposed on the conductive feature 53. In some embodiments, the conductive feature 55 may be disposed on the dielectric layer 43. In some embodiments, the conductive feature 55 may be configured to electrically connect the fuse element 21, conductive feature 51 and conductive feature 53. In some embodiments, the conductive feature 55 may be embedded in the dielectric layer 43. The material of the conductive feature 55 may be the same as or similar to that of the conductive feature 51.

In some embodiments, the fuse element 21 and the doped region 31 may form a PN junction. In some embodiments, the fuse element 21 and the doped region 32 may form a PN junction. In some embodiments, the fuse element 21 and the doped region 33 may form a PN junction. In some embodiments, the breakdown voltage between the fuse element 21 and the doped region 31 may be less than the breakdown voltage between the fuse element 21 and the doped region 32. In some embodiments, the breakdown voltage between the fuse element 21 and the doped region 31 may be less than the breakdown voltage between the fuse element 21 and the doped region 33.

In some embodiments, the breakdown voltage between the fuse element 21 and the doped region 31 may range from about 4 V to about 5 V, such as 4 V, 4.2 V, 4.4 V, 4.6 V, 4.8V or 5V. In some embodiments, the breakdown voltage between the fuse element 21 and the doped region 32 may range from about 8 V to about 10 V, such as 8V, 8.4 V, 8.8 V, 9.2 V, 9.6 V or 10 V. In some embodiments, the breakdown voltage between the fuse element 21 and the doped region 33 may range from about 8 V to about 10 V, such as 8V, 8.4 V, 8.8 V, 9.2 V, 9.6 V or 10 V. For example, when a power of 5 V is imposed on the fuse element 21, the fuse structure 20 may be turned on, thereby blowing out the fuse structure 20. A signal (e.g., electrical signal) may be transmitted to the doped region 34 through the fuse medium 22, the boundaries $31s1$ and $32s1$.

In a comparative semiconductor device, a polysilicon and a silicon oxide are utilized as a fuse element and fuse medium respectively. The comparative semiconductor device may have a relatively large breakdown voltage, which may range from about 5 V to about 6V or more. In the embodiments of the present disclosure, the semiconductor device $1a$ may have a relatively small breakdown voltage. The fuse structure (e.g., 20) may be embedded in a substrate (e.g., 10), which thereby reduce the Z-dimension of the semiconductor device $1a$. Further, the manufacturing process of forming a logic device may be applied to the fuse structure, which benefits the cost of formation of the semiconductor device $1a$.

Figure 2A:
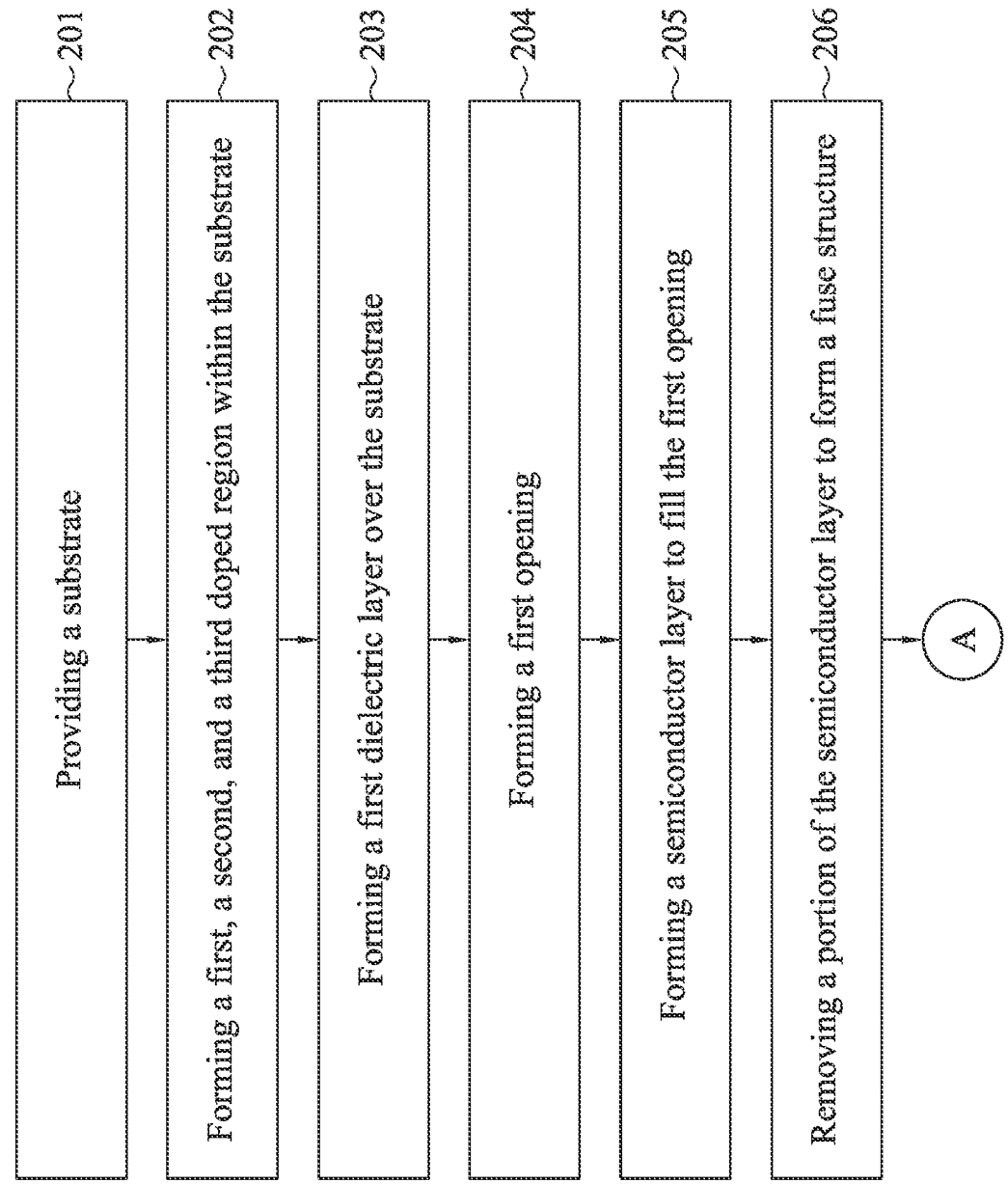
FIG. 2A and FIG. 2B are flowcharts of manufacturing a semiconductor device, in accordance with some embodiments of the present disclosure.
Figure 2B:
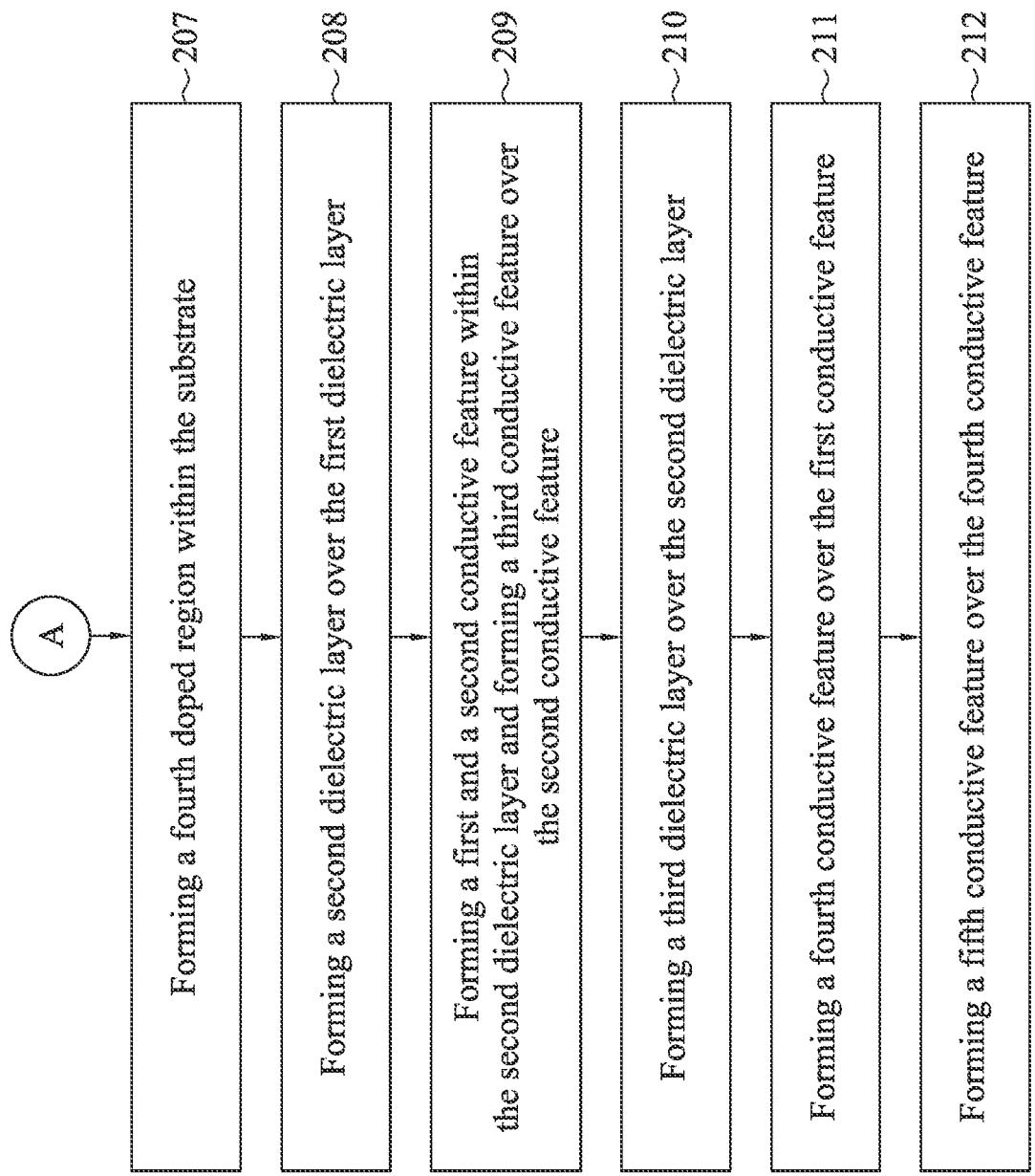

FIG. 2A and FIG. 2B are flowcharts of a method 200 for manufacturing a semiconductor device, in accordance with some embodiments of the present disclosure.

Referring to FIG. 2A, the method 200 begins with operation 201 in which a substrate may be provided. The substrate may include a well region. The substrate may include an upper surface. The well region may include a first conductive type. In some embodiments, the first conductive type is a p-type. In some embodiments, the first conductive type is an n-type.

The method 200 continues with operation 202 in which a first doped region, a second doped region, and a third doped region may be formed within the substrate. Each of the first doped region, second doped region, and third doped region may have the first conductive type. In some embodiments, the first doped region may be spaced apart from the upper surface of the substrate. In some embodiments, the third doped region may be spaced apart from the upper surface of the substrate. In some embodiments, the first doped region may be formed between the second doped region and third doped region. In some embodiments, the first doped region may have a dopant concentration greater than that of the second doped region. In some embodiments, the first doped region may have a dopant concentration greater than that of the third doped region.

In some embodiments, a first boundary of the first doped region and a second boundary of the second doped region may be substantially continuous. In some embodiments, a first boundary of the first doped region and a third boundary of the third doped region may be substantially continuous. In some embodiments, the second doped region may extend from the upper surface of the substrate. In some embodiments, each of the first doped region, second doped region, and third doped region may have a circular profile, an elliptical profile, or other suitable profiles.

The method 200 continues with operation 203 in which a first dielectric layer may be formed. The first dielectric layer may be formed on the upper surface of the substrate.

The method 200 continues with operation 204 in which a first opening may be formed. In some embodiments, the first opening may penetrate the substrate. In some embodiments, the first opening may penetrate the first dielectric layer. In some embodiments, the first opening may penetrate the first doped region. In some embodiments, the first opening may penetrate the second doped region. In some embodiments, the third doped region may be exposed by the first opening.

The method 200 continues with operation 205 in which a semiconductor layer may be formed. In some embodiments, the semiconductor layer may fill the first opening. In some embodiments, the semiconductor layer may cover the upper surface of the substrate. In some embodiments, the semiconductor layer may include a semiconductor material, such as polysilicon, silicon-germanium, and/or other suitable materials. In some embodiments, the semiconductor layer may include dopants with a second conductive type.

The method 200 continues with operation 206 in which a portion of the semiconductor layer may be removed, which thereby forms a fuse element. In some embodiments, the fuse element is located within the first opening. In some embodiments, the fuse element may be in contact with the first dielectric layer. In some embodiments, the fuse element may be in contact with the first doped region. In some embodiments, the fuse element may be in contact with the second doped region. In some embodiments, the first doped region may be in contact with the third doped region. In some embodiments, the fuse element may be surrounded by the first dielectric layer. In some embodiments, the fuse element may be surrounded by the first doped region. In some embodiments, the fuse element may be surrounded by the second doped region. In some embodiments, the fuse element may be surrounded by the third doped region. In some embodiments, the upper surface of the fuse element may be substantially coplanar with an upper surface of the first dielectric layer. In some embodiments, the upper surface of the fuse element may be higher than that of the substrate. In some embodiments, the first doped region may serve as a fuse medium. In some embodiments, the fuse element and the fuse medium may collectively serve as a fuse structure.

Referring to FIG. 2B, the method 200 continues with operation 207 in which a fourth doped region may be formed. In some embodiments, the fourth doped region may have the first conductive type. In some embodiments, the fourth doped region may extend from the upper surface of the substrate. In some embodiments, the fourth doped region may be spaced apart from the fuse element. In some embodiments, a mask may be formed on the upper surface of the substrate. In some embodiments, the mask may be configured to define a pattern of the fourth doped region.

The method 200 continues with operation 208 in which a second dielectric layer may be formed. In some embodiments, the second dielectric layer may be formed on the first dielectric layer. In some embodiments, the second dielectric layer may be patterned to form a second opening. In some embodiments, the fuse element may be exposed by the second opening.

The method 200 continues with operation 209 in which a first conductive feature, a second conductive feature, and a third conductive feature may be formed. In some embodiments, the first conductive feature may be formed within the second opening. In some embodiments, the second conductive feature may be formed within the second opening. In some embodiments, the first conductive feature may be formed on the fuse element. In some embodiments, the second conductive feature may be formed on the fourth doped region. In some embodiments, the third conductive feature may be formed on the second conductive feature. In some embodiments, the third conductive feature may be form on the second dielectric layer.

The method 200 continues with operation 210 in which a third dielectric layer may be formed. In some embodiments, the third dielectric layer may be formed on the second dielectric layer. In some embodiments, the third dielectric layer may be patterned to form a third opening. In some embodiments, the first conductive feature may be exposed by the third opening.

The method 200 continues with operation 211 in which a fourth conductive feature may be formed. In some embodiments, the fourth conductive feature may be formed within the third opening. In some embodiments, the fourth conductive feature may be formed on the first conductive feature.

The method 200 continues with operation 212 in which a fifth conductive feature may be formed, which thereby produces a semiconductor device. In some embodiments, the fifth conductive feature may be formed on the fourth conductive feature.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 2A and FIG. 2B. In some embodiments, the method 200 can include one or more operations depicted in FIG. 2A and FIG. 2B.

FIG. 3A to FIG. 14A and FIG. 3B to FIG. 14B illustrate one or more stages of an exemplary method for manufacturing a semiconductor device according to some embodiments of the present disclosure, wherein FIG. 3A to FIG. 14A are top views, and FIG. 3B to FIG. 14B are cross-sectional views along line A-A' of FIG. 3A to FIG. 14A, respectively. It should be noted that, for brevity, some elements are illustrated in cross-sectional views but are omitted in top views.

Figure 3A:
FIG. 3A illustrates one or more stages of an exemplary method for manufacturing a semiconductor device according to some embodiments of the present disclosure.
Figure 3B:
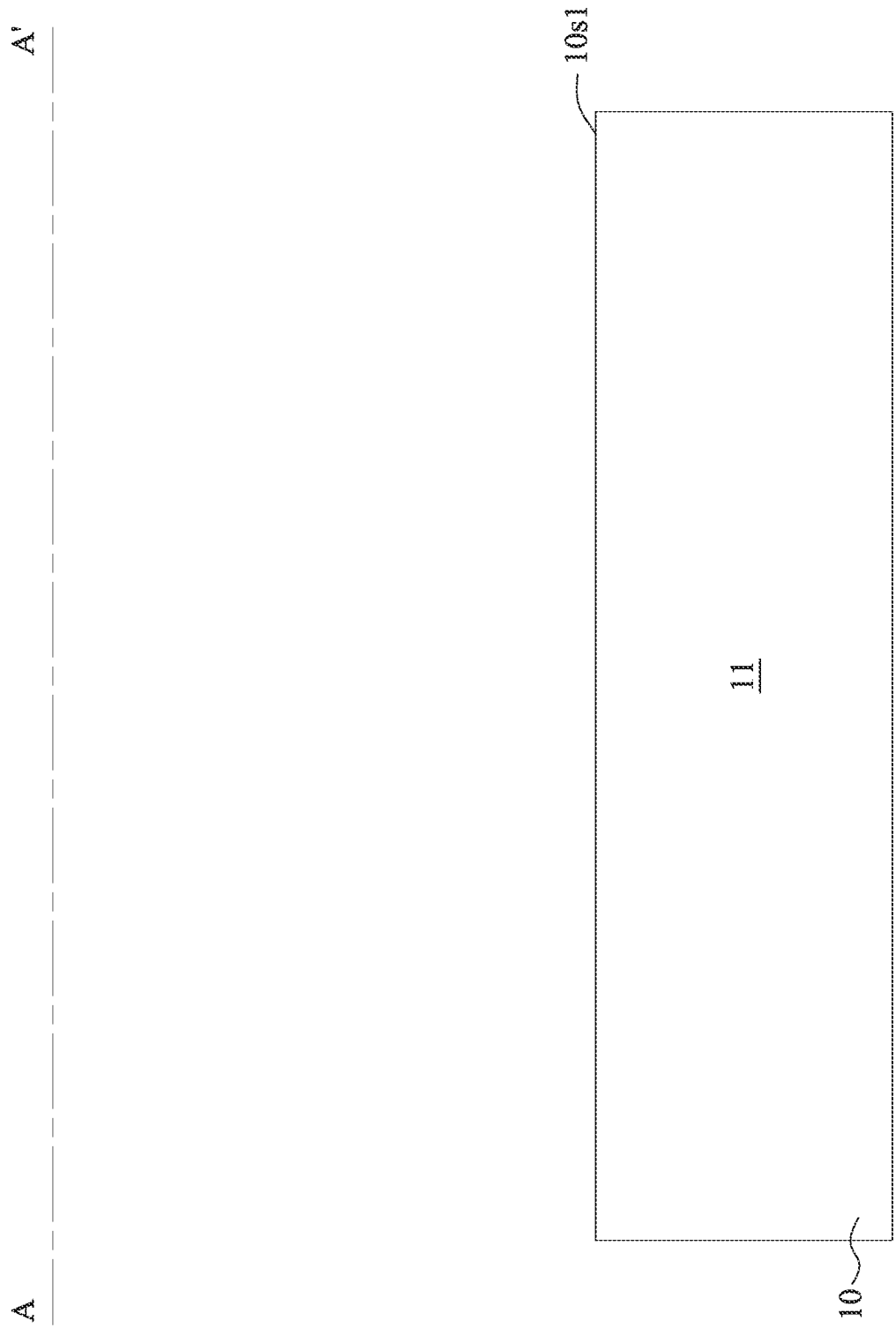
FIG. 3B is a cross-sectional view along line A-A' of FIG. 3A, in accordance with some embodiments of the present disclosure.

As shown in FIG. 3A and FIG. 3B, a substrate 10 may be provided. The substrate 10 may include a well region 11. The substrate 10 may include a surface $10s1$. The well region 11 may include a first conductive type. In some embodiments, the first conductive type is a p-type. In some embodiments, the first conductive type is an n-type.

Figure 4A:
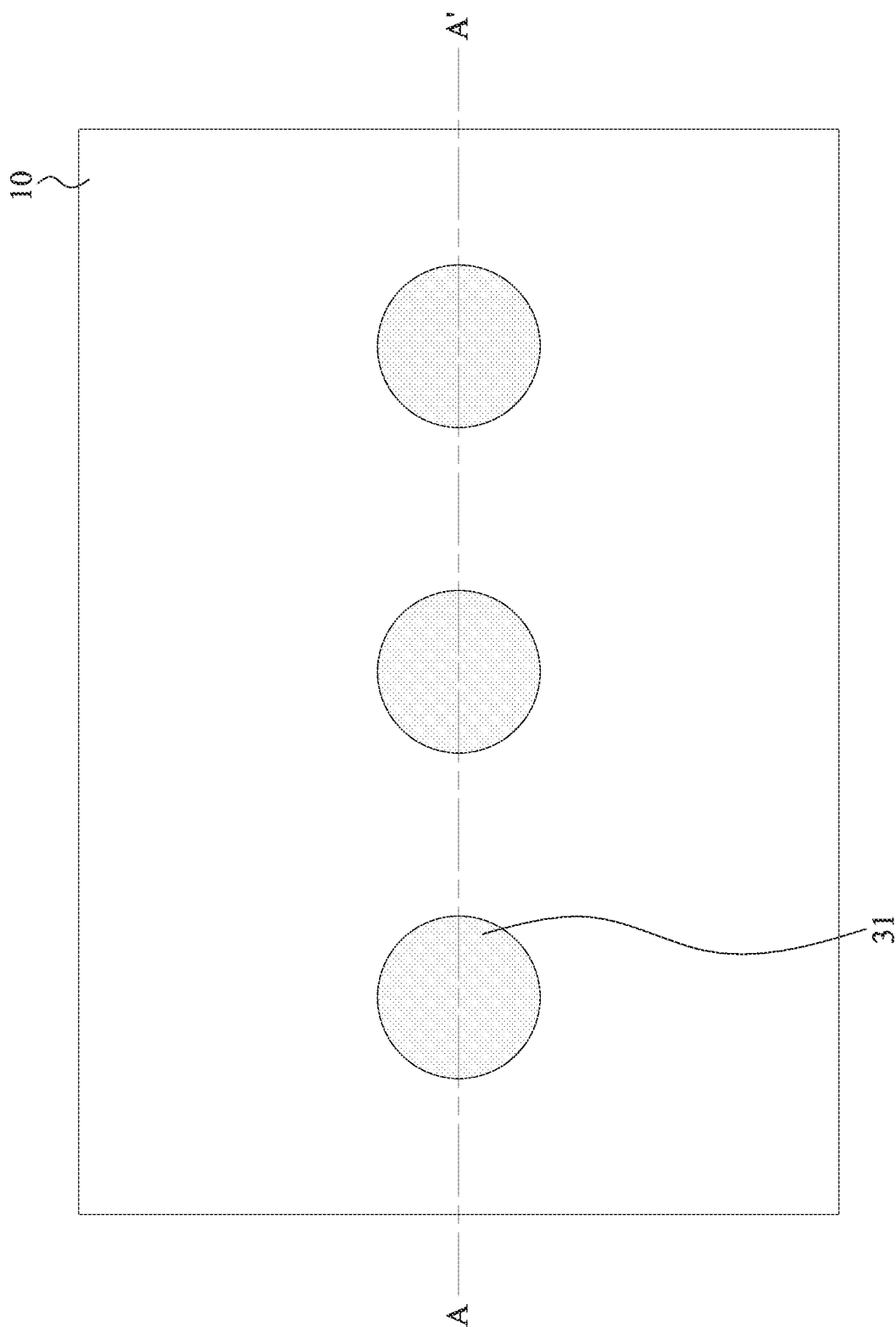
FIG. 4A illustrates one or more stages of an exemplary method for manufacturing a semiconductor device according to some embodiments of the present disclosure.
Figure 4B:
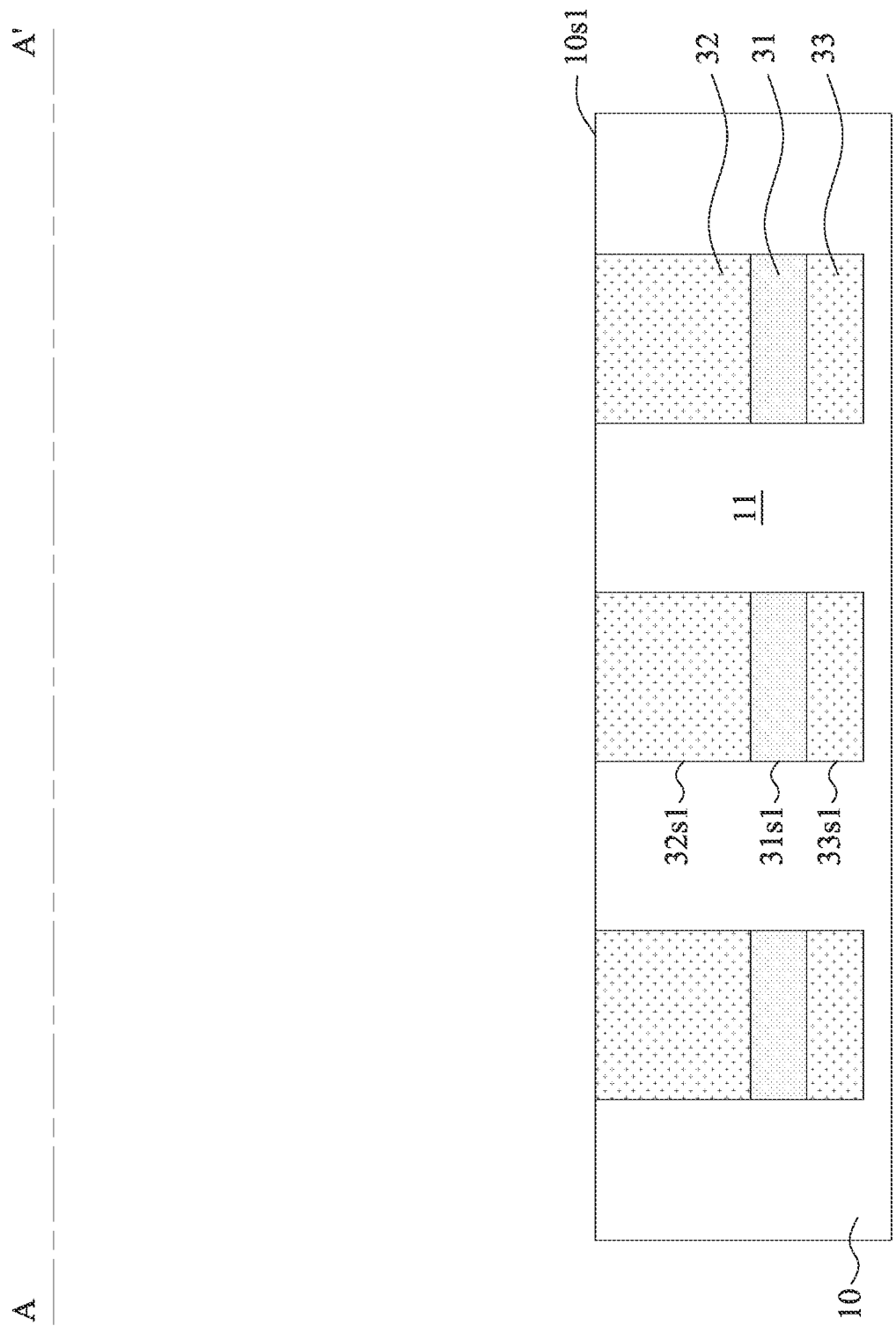
FIG. 4B is a cross-sectional view along line A-A' of FIG. 4A, in accordance with some embodiments of the present disclosure.

As shown in FIG. 4A and FIG. 4B, doped regions 31, 32, and 33 may be formed. Each of the doped regions 31, 32, and 33 may have the first conductive type. In some embodiments, the doped region 31 may be spaced apart from the surface $10s1$ of the substrate 10. In some embodiments, the doped region 33 may be spaced apart from the surface $10s1$ of the substrate 10. In some embodiments, the doped region 31 may be formed between the doped regions 32 and 33. In some embodiments, the doped region 31 may have a dopant concentration greater than that of the doped region 32. In some embodiments, the doped region 31 may have a dopant concentration greater than that of the doped region 33. In some embodiments, a boundary $31s1$ of the doped region 31 and a boundary $32s1$ of the doped region 32 may be substantially continuous. In some embodiments, a boundary $31s1$ of the doped region 31 and a boundary $33s1$ of the doped region 33 may be substantially continuous. In some embodiments, the doped region 32 may extend from the surface $10s1$ of the substrate 10. In some embodiments, each of the doped regions 31, 32, and 33 may have a circular profile, an elliptical profile, or other suitable profiles.

Figure 5A:
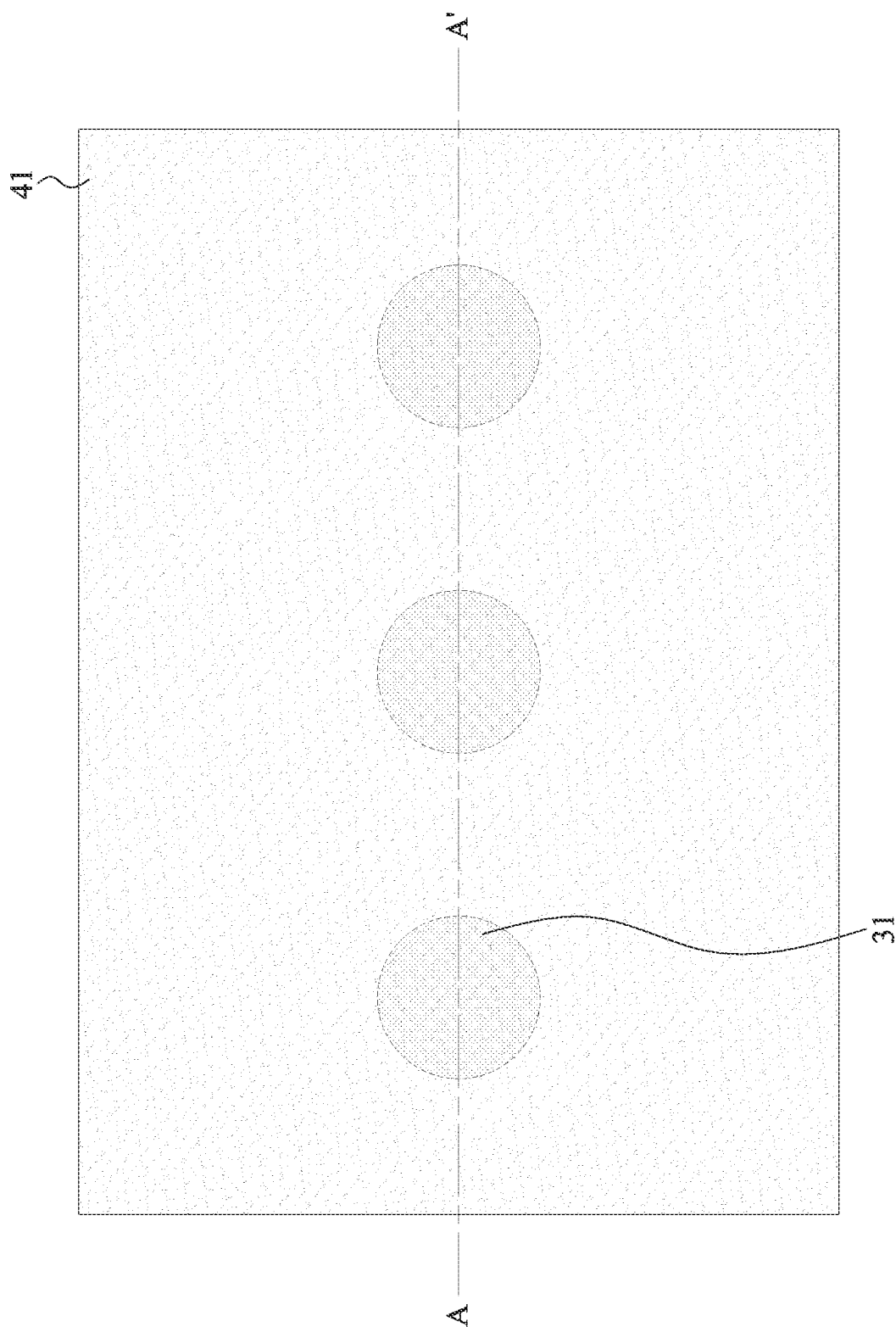
FIG. 5A illustrates one or more stages of an exemplary method for manufacturing a semiconductor device according to some embodiments of the present disclosure.
Figure 5B:
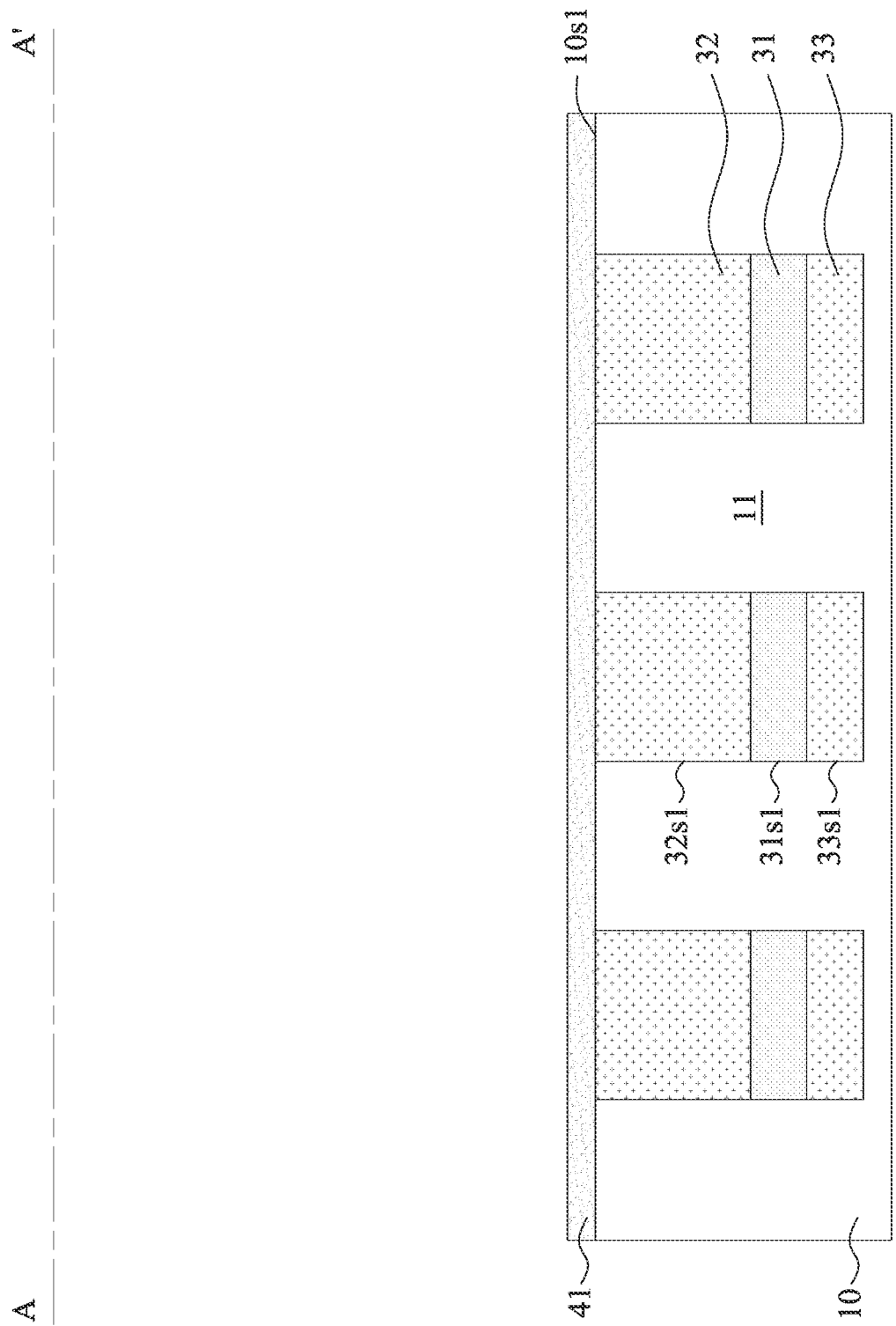
FIG. 5B is a cross-sectional view along line A-A' of FIG. 5A, in accordance with some embodiments of the present disclosure.

As shown in FIG. 5A and FIG. 5B, a dielectric layer 41 may be formed. The dielectric layer 41 may be formed on the surface $10s1$ of the substrate 10. The dielectric layer 41 may be formed by chemical vapor deposition (CVD), atomic layer deposition (ALD), physical vapor deposition (PVD), low-pressure chemical vapor deposition (LPCVD), or other suitable processes.

Figure 6A:
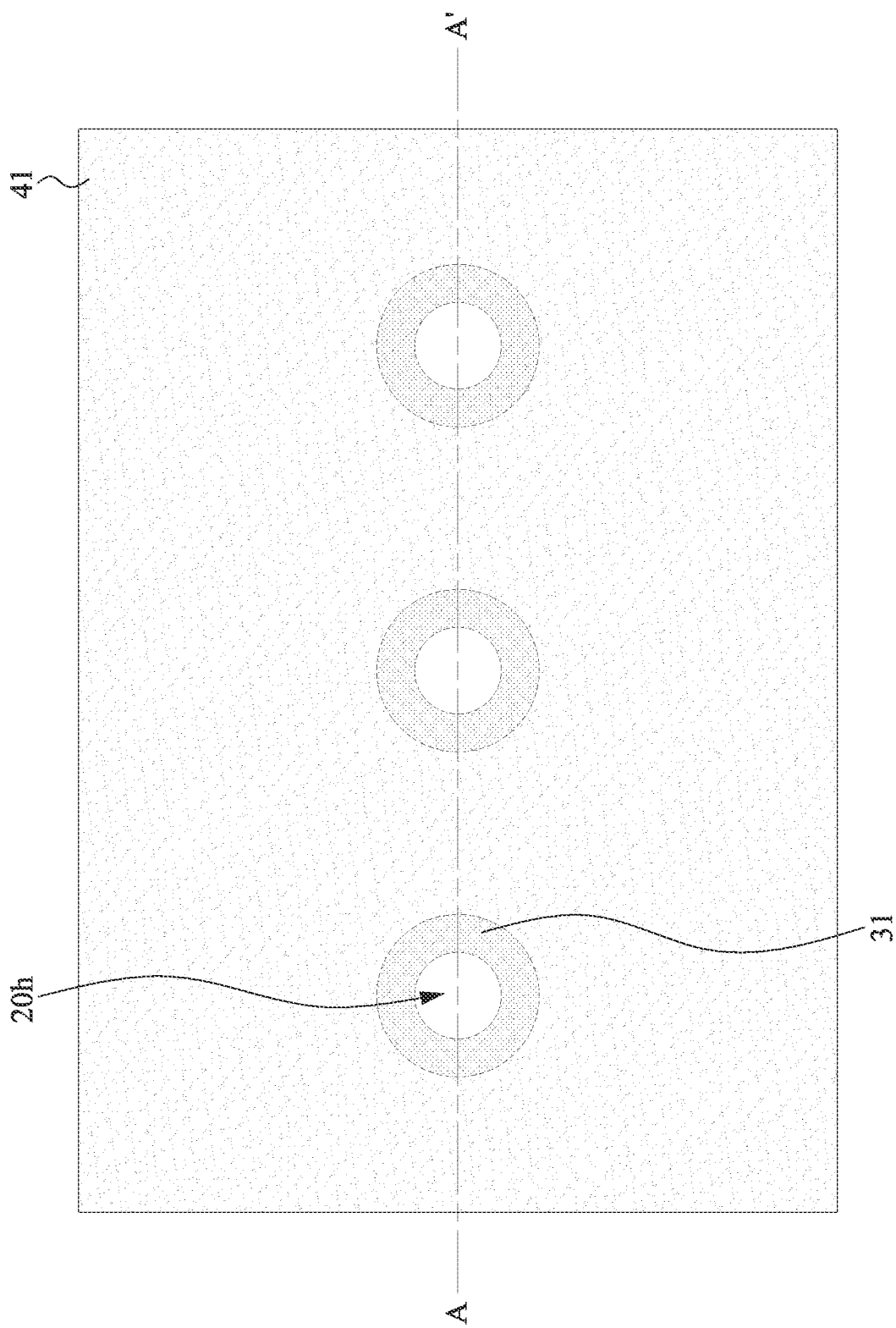
FIG. 6A illustrates one or more stages of an exemplary method for manufacturing a semiconductor device according to some embodiments of the present disclosure.
Figure 6B:
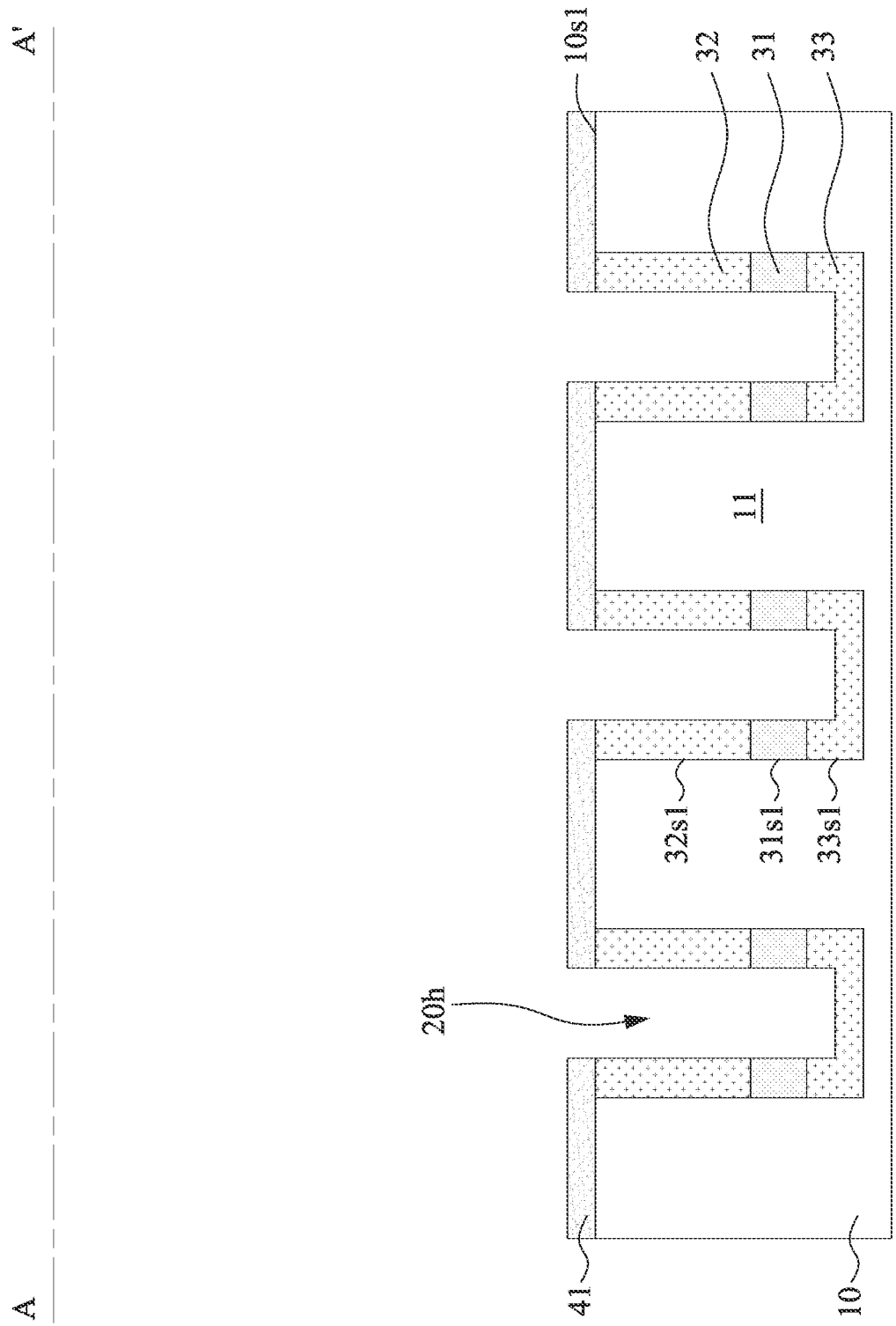
FIG. 6B is a cross-sectional view along line A-A' of FIG. 6A, in accordance with some embodiments of the present disclosure.

As shown in FIG. 6A and FIG. 6B, an opening $20h$ may be formed. In some embodiments, the opening $20h$ may penetrate the substrate 10. In some embodiments, the opening $20h$ may penetrate the dielectric layer 41. In some embodiments, the opening $20h$ may penetrate the doped region 31. In some embodiments, the opening $20h$ may penetrate the doped region 32. In some embodiments, the doped region 33 may be exposed by the opening $20h$. The opening $20h$ may be formed by a patterning process. The patterning process may include a lithography process, an etching process and other suitable processes. The photolithography process may include photoresist coating (e.g., spin-on coating), soft baking, mask aligning, exposure, post-exposure baking, developing the photoresist, rinsing and drying (e.g., hard baking). The etching process may include, for example, a dry etching process or a wet etching process.

Figure 7A:
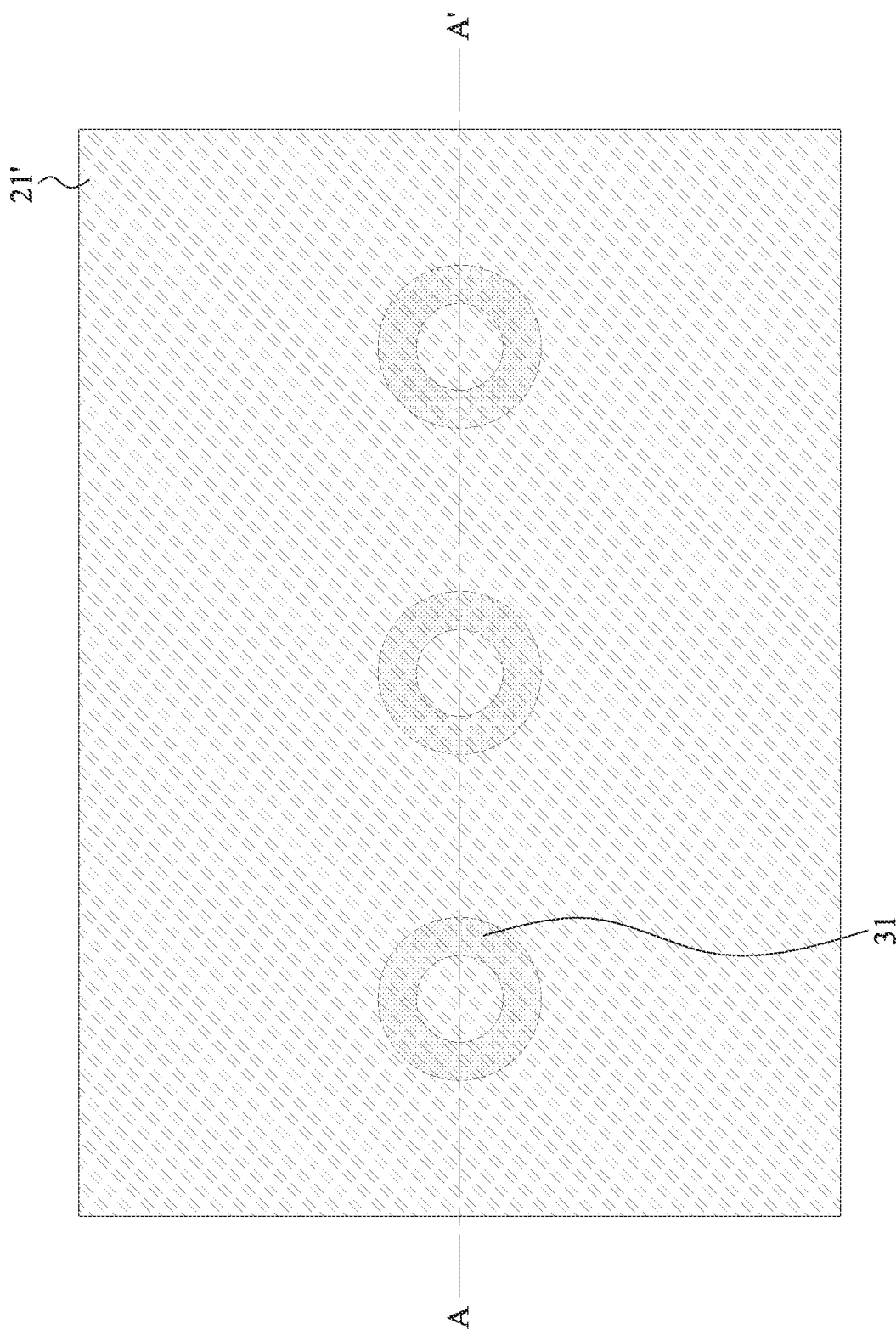
FIG. 7A illustrates one or more stages of an exemplary method for manufacturing a semiconductor device according to some embodiments of the present disclosure.
Figure 7B:
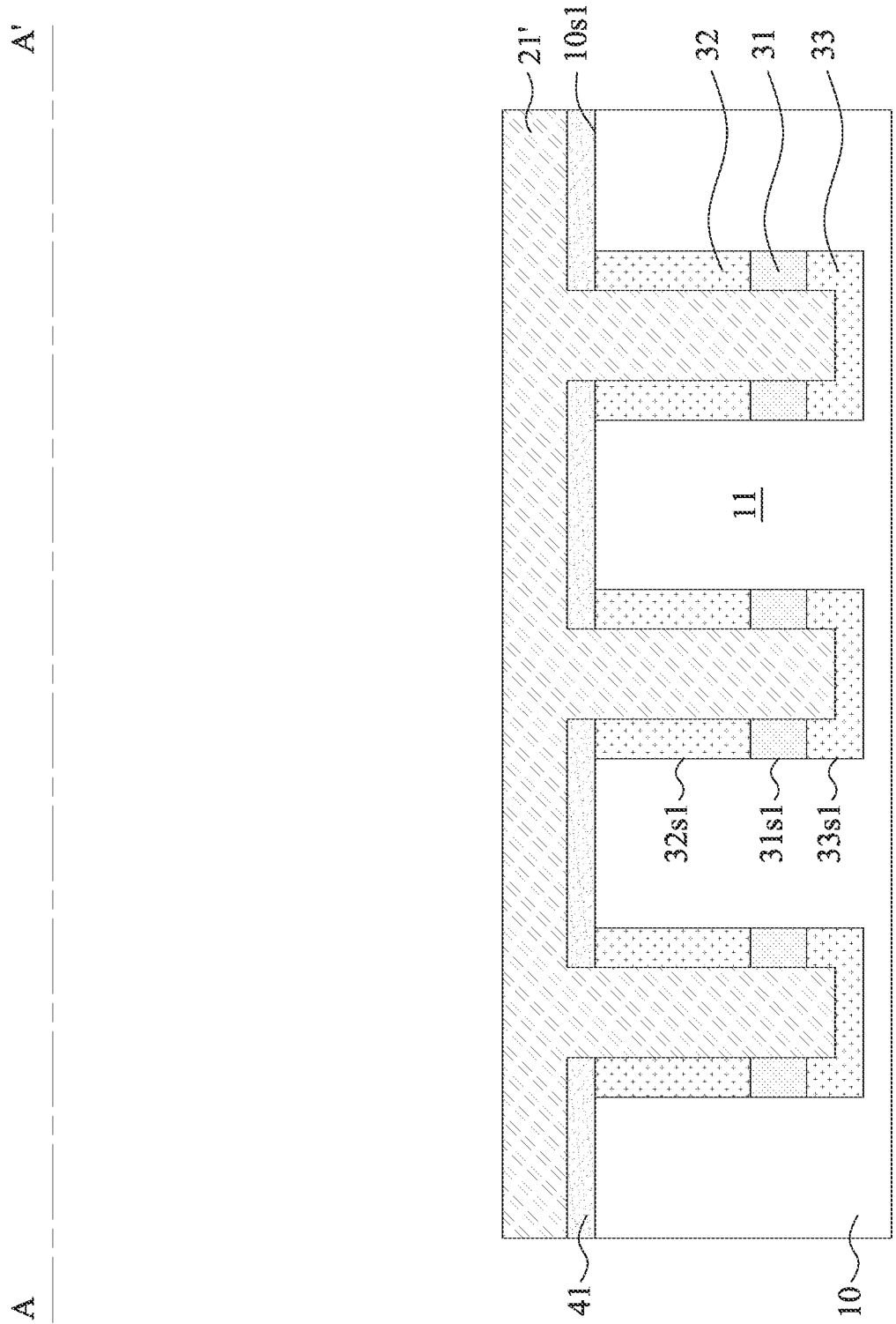
FIG. 7B is a cross-sectional view along line A-A' of FIG. 7A, in accordance with some embodiments of the present disclosure.

As shown in FIG. 7A and FIG. 7B, a semiconductor layer 21' may be formed. In some embodiments, the semiconductor layer 21' may fill the opening $20h$. In some embodiments, the semiconductor layer 21' may cover the surface $10s1$ of the substrate 10. In some embodiments, the semiconductor layer 21' may include a semiconductor material, such as polysilicon, silicon-germanium, and/or other suitable materials. In some embodiments, the semiconductor layer 21' may include dopants with a second conductive type. The semiconductor layer 21' may be formed by CVD, ALD, PVD, LPCVD, or other suitable processes.

Figure 8A:
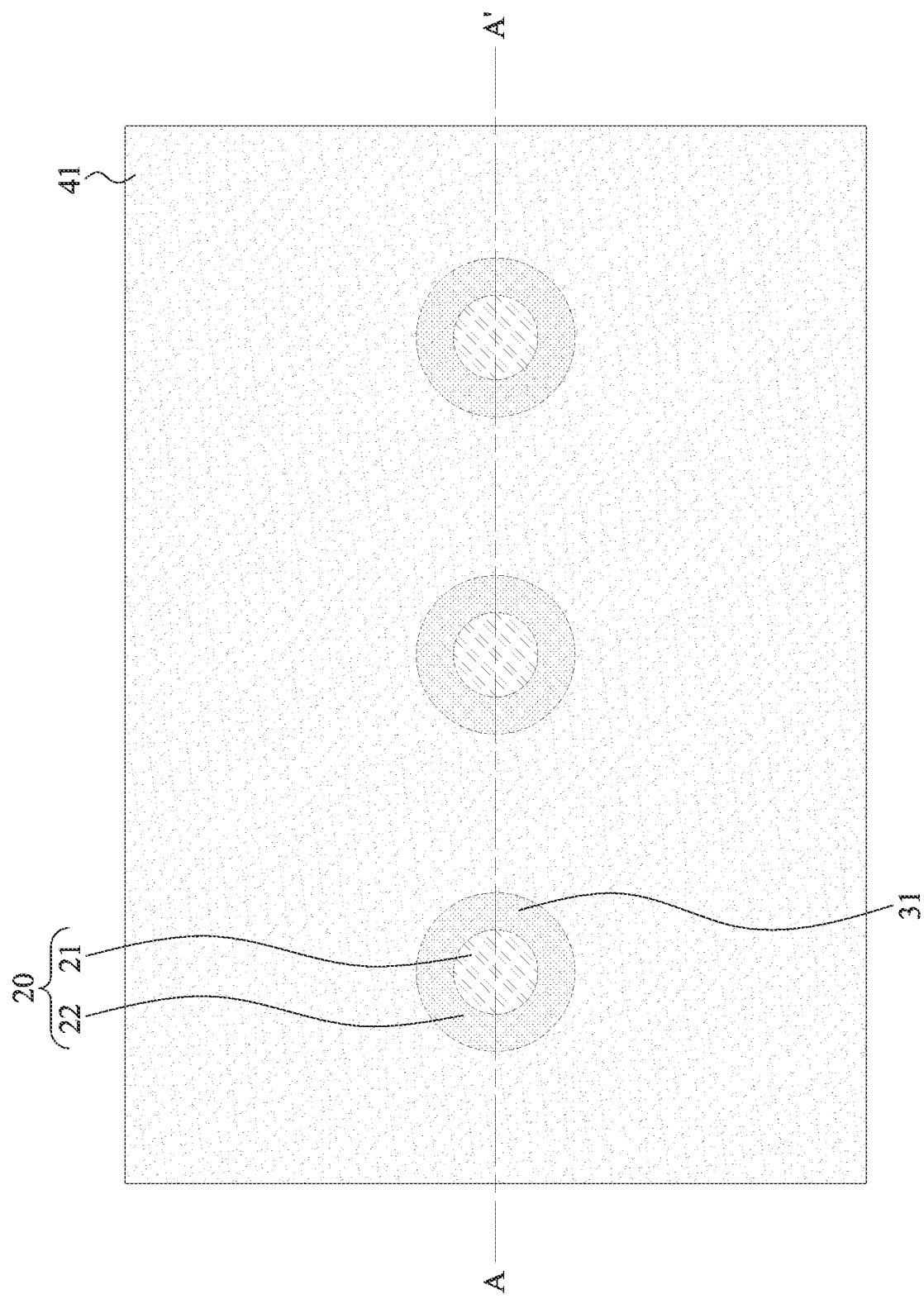
FIG. 8A illustrates one or more stages of an exemplary method for manufacturing a semiconductor device according to some embodiments of the present disclosure.
Figure 8B:
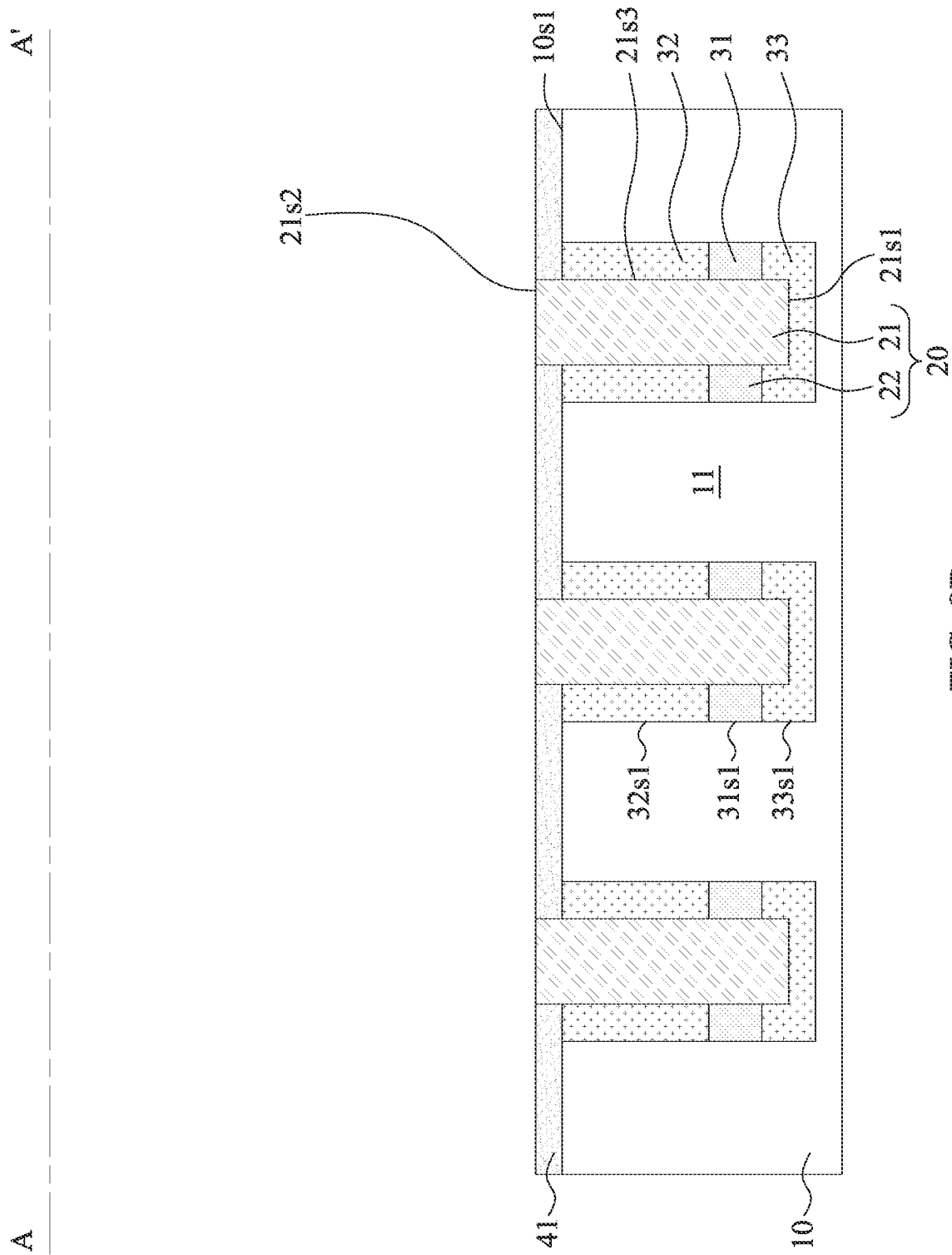
FIG. 8B is a cross-sectional view along line A-A' of FIG. 8A, in accordance with some embodiments of the present disclosure.

As shown in FIG. 8A and FIG. 8B, a portion of the semiconductor layer 21' may be removed, which thereby forms a fuse element 21. In some embodiments, the fuse element 21 is located within the opening $20h$. In some embodiments, the fuse element 21 may be in contact with the dielectric layer 41. In some embodiments, the fuse element 21 may be in contact with the doped region 31. In some embodiments, the fuse element 21 may be in contact with the doped region 32. In some embodiments, the doped region 31 may be in contact with the doped region 33. In some embodiments, the fuse element 21 may be surrounded by the dielectric layer 41. In some embodiments, the fuse element 21 may be surrounded by the doped region 31. In some embodiments, the fuse element 21 may be surrounded by the doped region 32. In some embodiments, the fuse element 21 may be surrounded by the doped region 33. In some embodiments, the surface 21s2 of the fuse element 21 may be substantially coplanar with an upper surface (not annotated in the figures) of the dielectric layer 41. In some embodiments, the surface 21s2 of the fuse element 21 may be higher than the surface 10s1 of the substrate 10. In some embodiments, the doped region 32 may serve as a fuse medium 22. In some embodiments, the fuse element 21 and the fuse medium 22 may collectively serve as a fuse structure 20.

Figure 9A:
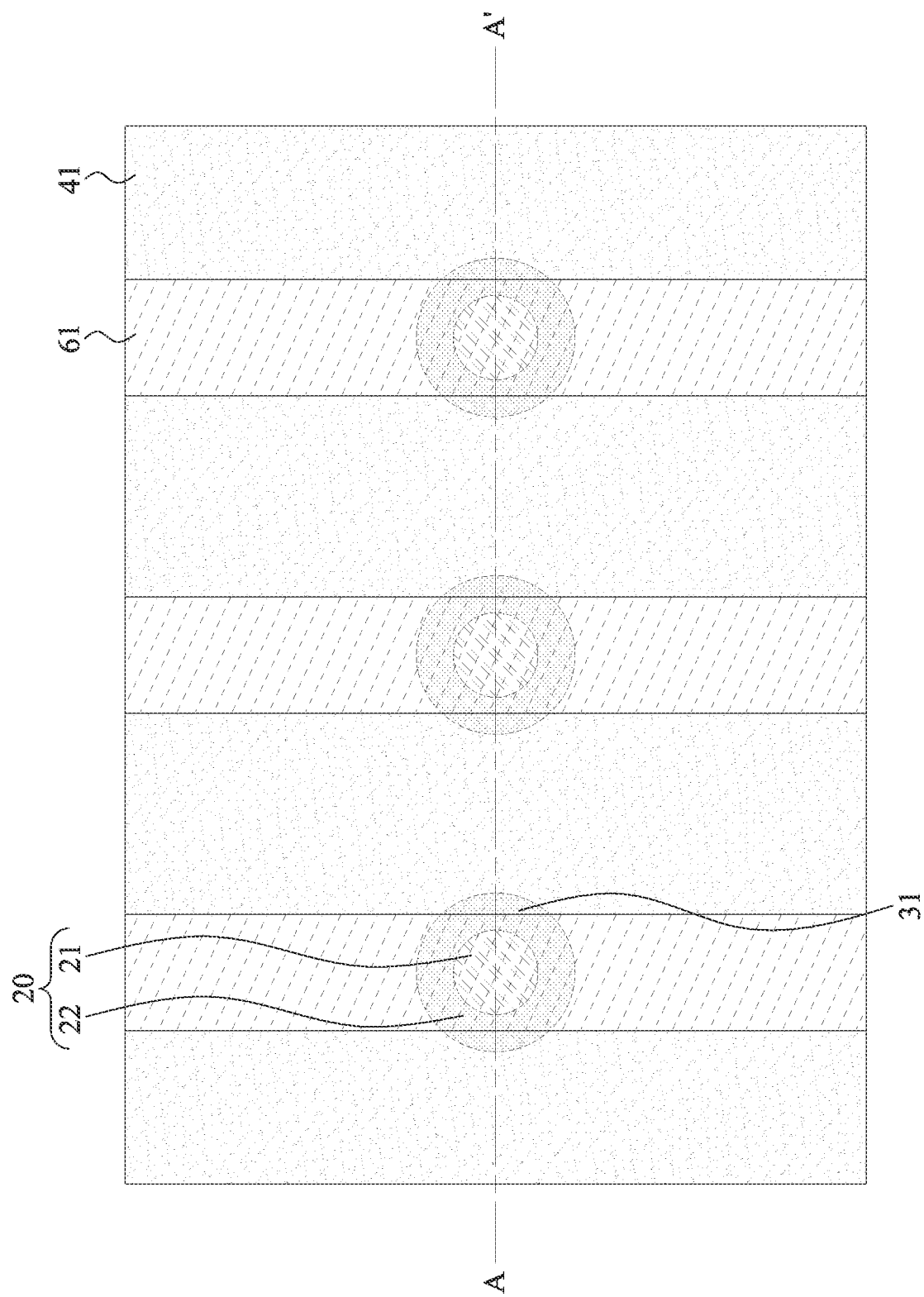
FIG. 9A illustrates one or more stages of an exemplary method for manufacturing a semiconductor device according to some embodiments of the present disclosure.
Figure 9B:
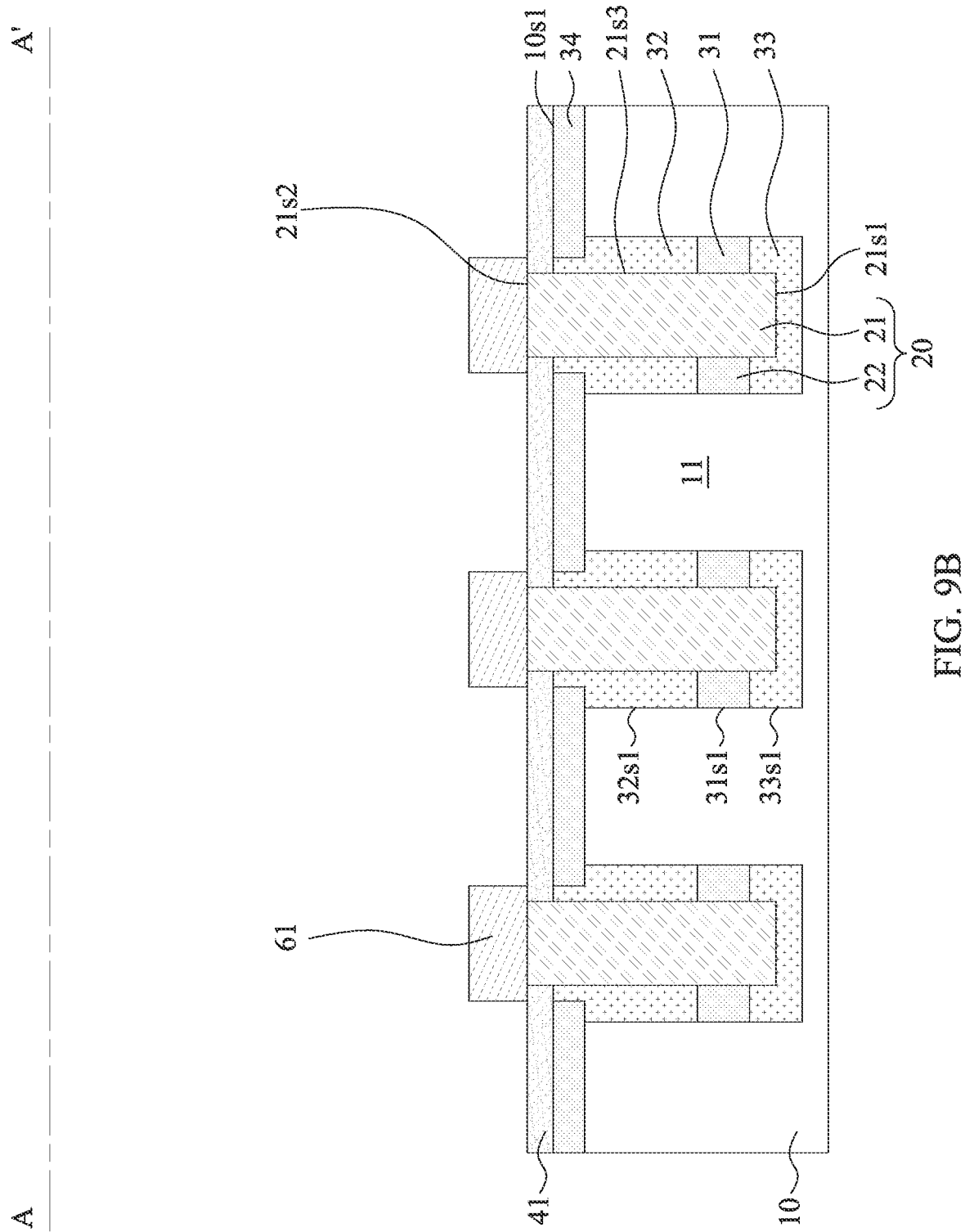
FIG. 9B is a cross-sectional view along line A-A' of FIG. 9A, in accordance with some embodiments of the present disclosure.

As shown in FIG. 9A and FIG. 9B, a doped region 34 may be formed. In some embodiments, the doped region 34 may have the first conductive type. In some embodiments, the doped region 34 may extend from the surface 10s1 of the substrate 10. In some embodiments, the doped region 34 may be spaced apart from the fuse element 21. In some embodiments, a mask 61 may be formed on the surface 10s1 of the substrate 10. In some embodiments, the mask 61 may be configured to define a pattern of the doped region 34. In some embodiments, the mask 61 may include, for example, a photoresist.

Figure 10A:
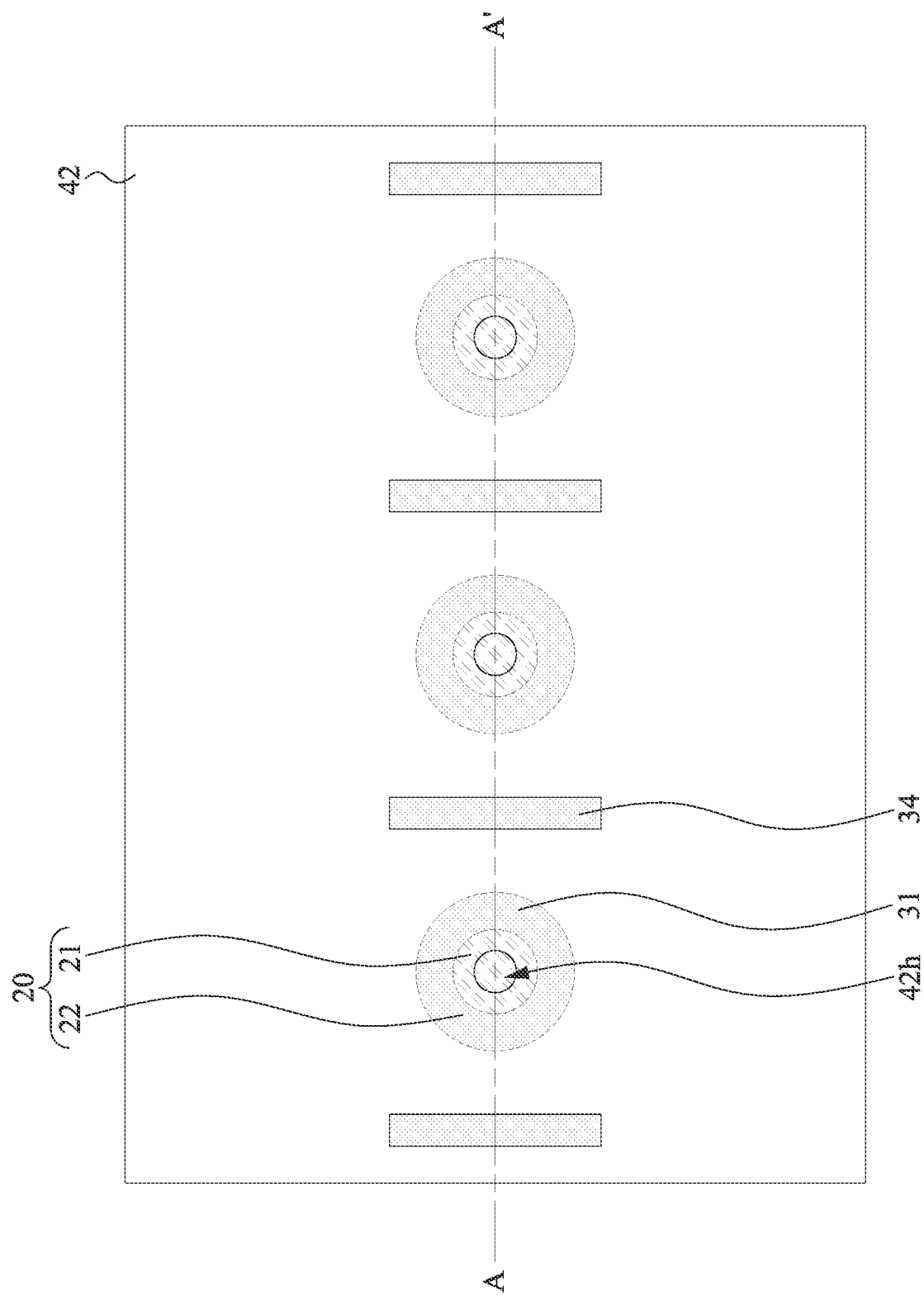
FIG. 10A illustrates one or more stages of an exemplary method for manufacturing a semiconductor device according to some embodiments of the present disclosure.
Figure 10B:
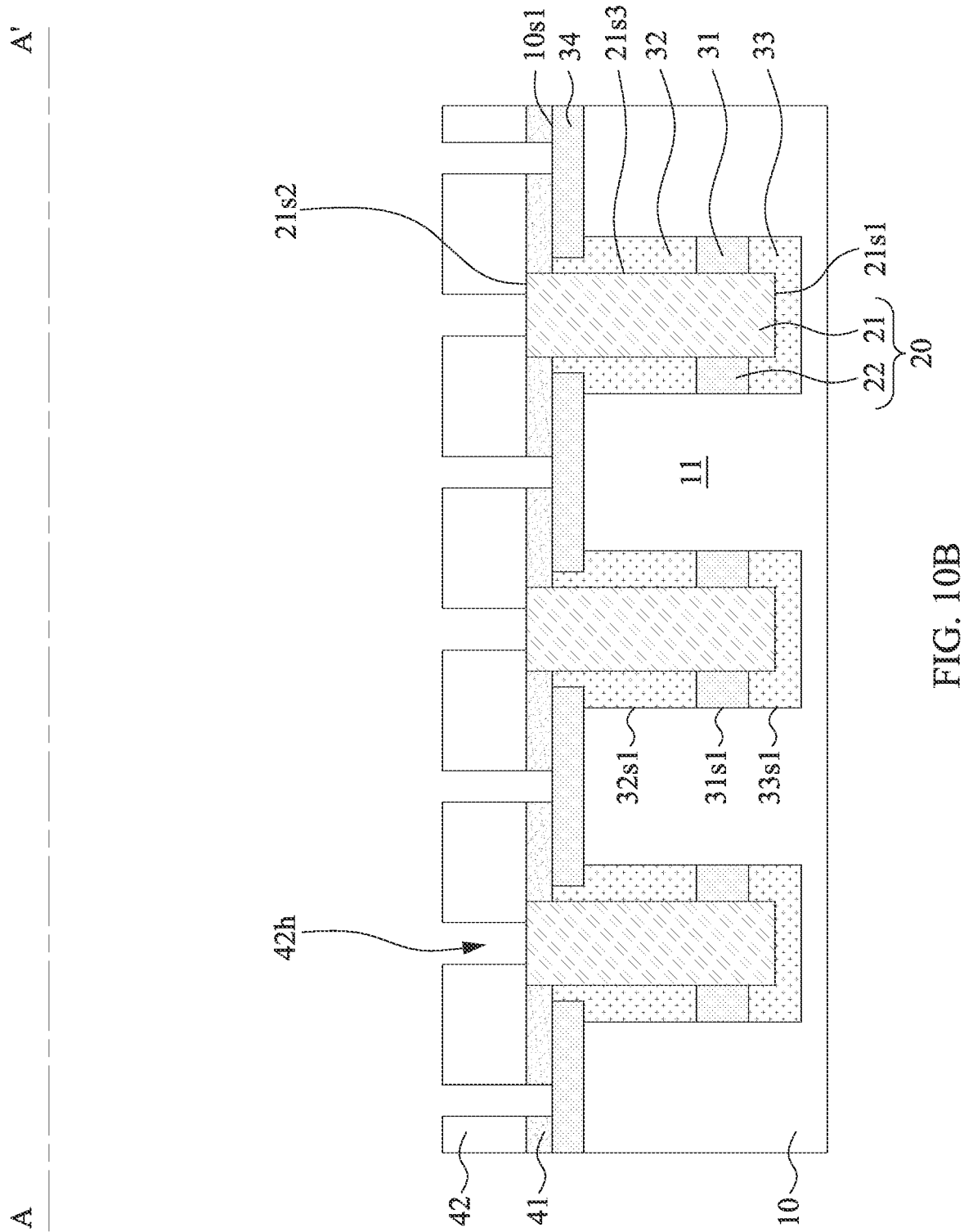
FIG. 10B is a cross-sectional view along line A-A' of FIG. 10A, in accordance with some embodiments of the present disclosure.

As shown in FIG. 10A and FIG. 10B, a dielectric layer 42 may be formed. In some embodiments, the mask 61 may be removed. In some embodiments, the dielectric layer 42 may be formed on the dielectric layer 41. In some embodiments, the dielectric layers 41 and 42 may be patterned to form an opening 42h. In some embodiments, the fuse element 21 may be exposed by the opening 42h. In some embodiments, the doped region 34 may be exposed by the opening 42h. The dielectric layer 42 may be formed by CVD, ALD, PVD, LPCVD, or other suitable processes.

Figure 11A:
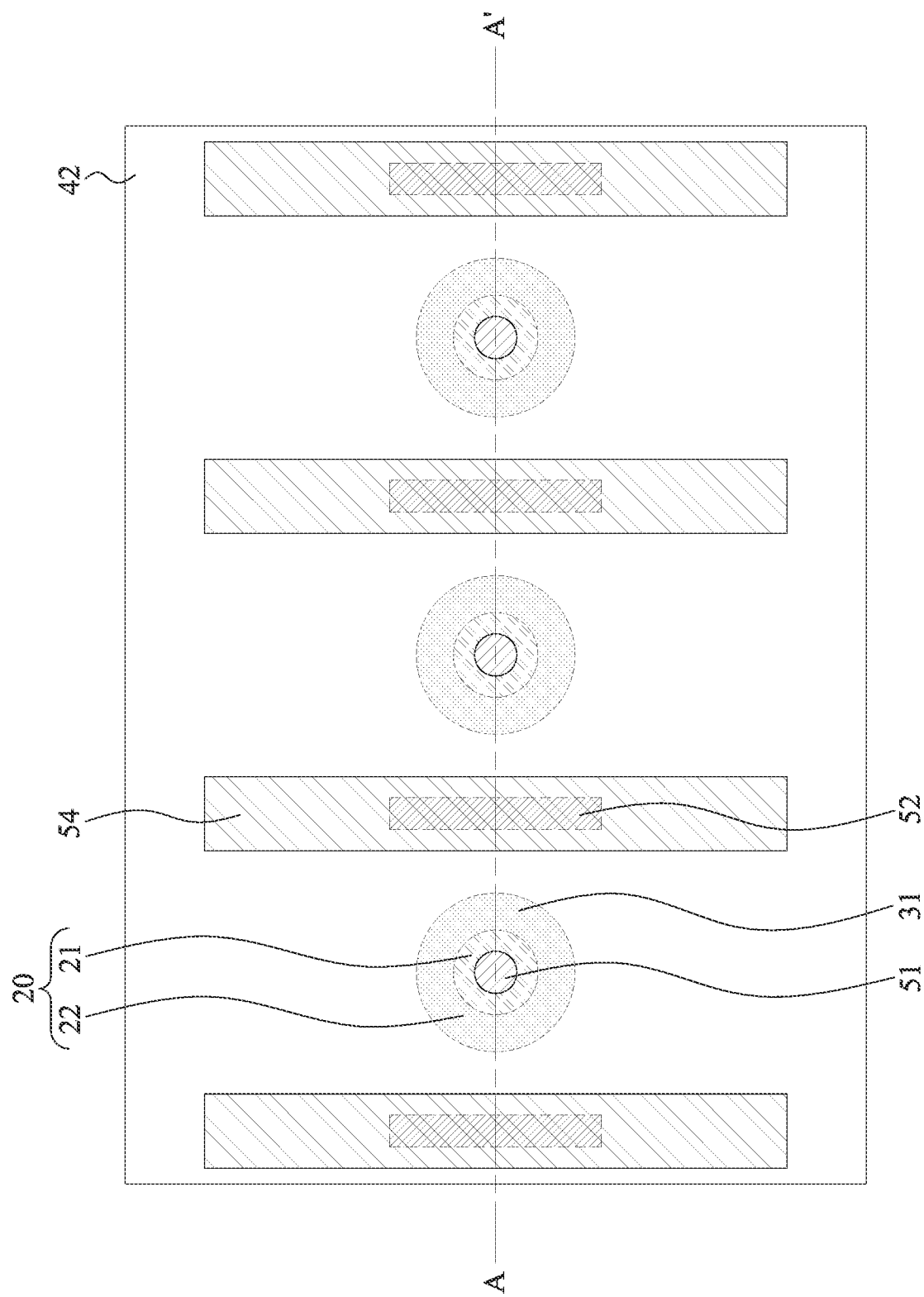
FIG. 11A illustrates one or more stages of an exemplary method for manufacturing a semiconductor device according to some embodiments of the present disclosure.
Figure 11B:
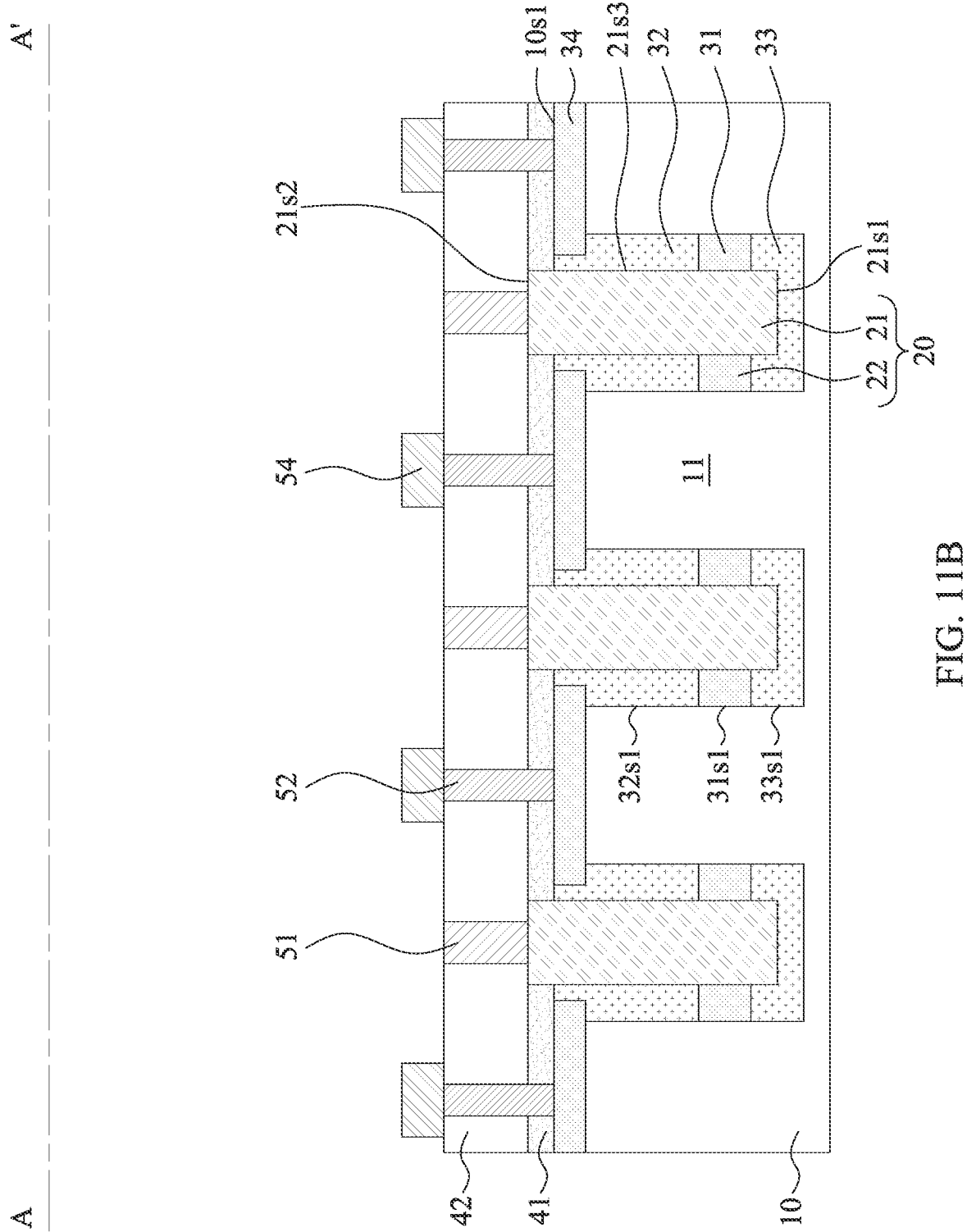
FIG. 11B is a cross-sectional view along line A-A' of FIG. 11A, in accordance with some embodiments of the present disclosure.

As shown in FIG. 11A and FIG. 11B, conductive features 51, 52, and 54 may be formed. In some embodiments, the conductive feature 51 may be formed within the opening 42h. In some embodiments, the conductive feature 52 may be formed within the opening 42h. In some embodiments, the conductive feature 51 may be formed on the fuse element 21. In some embodiments, the conductive feature 52 may be formed on the doped region 34. In some embodiments, the conductive feature 54 may be formed on the conductive feature 52. In some embodiments, the conductive feature 54 may be form on the dielectric layer 42. Each of the conductive features 51, 52, and 54 may be formed by sputtering, PVD, or other suitable processes.

Figure 12A:
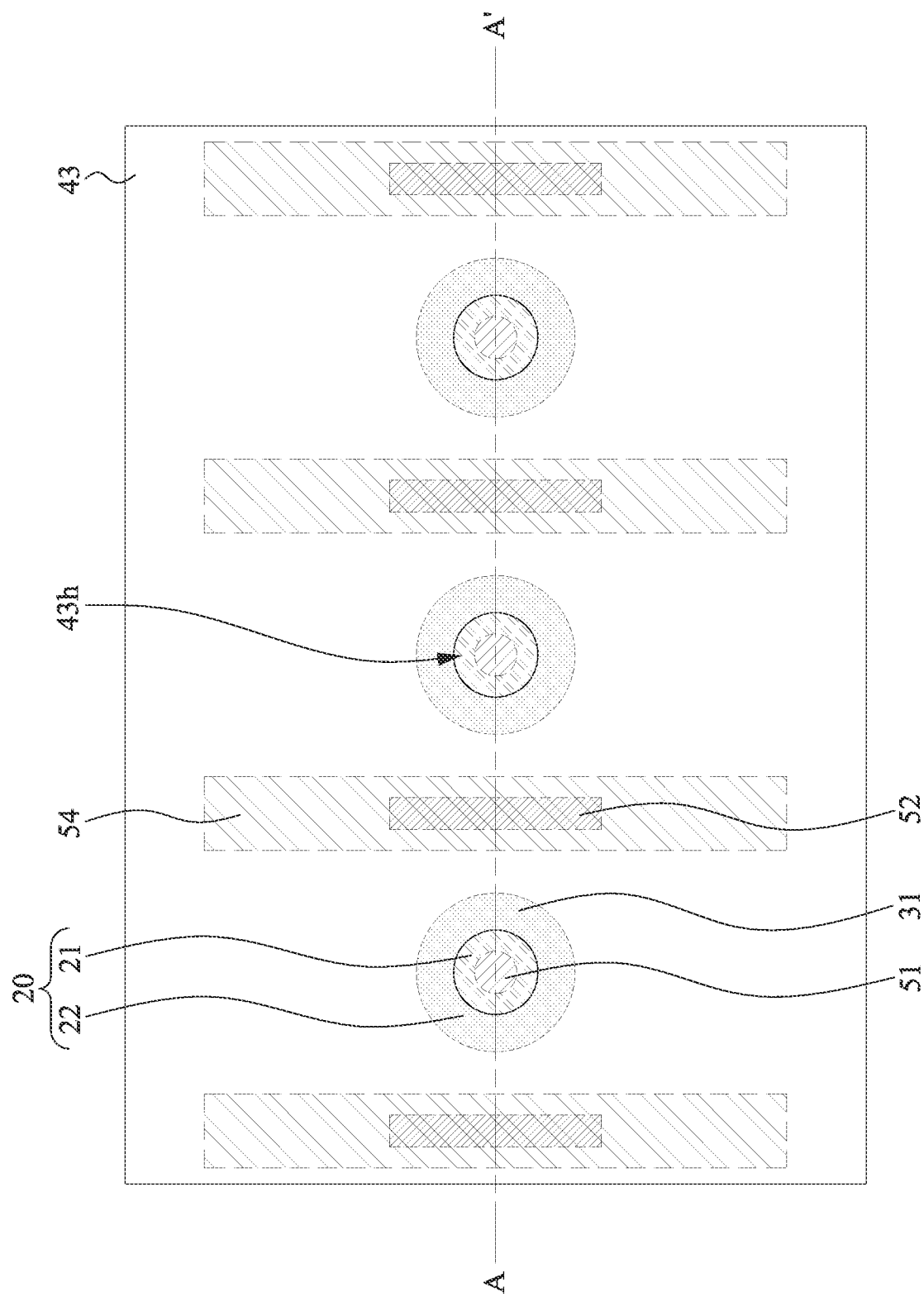
FIG. 12A illustrates one or more stages of an exemplary method for manufacturing a semiconductor device according to some embodiments of the present disclosure.
Figure 12B:
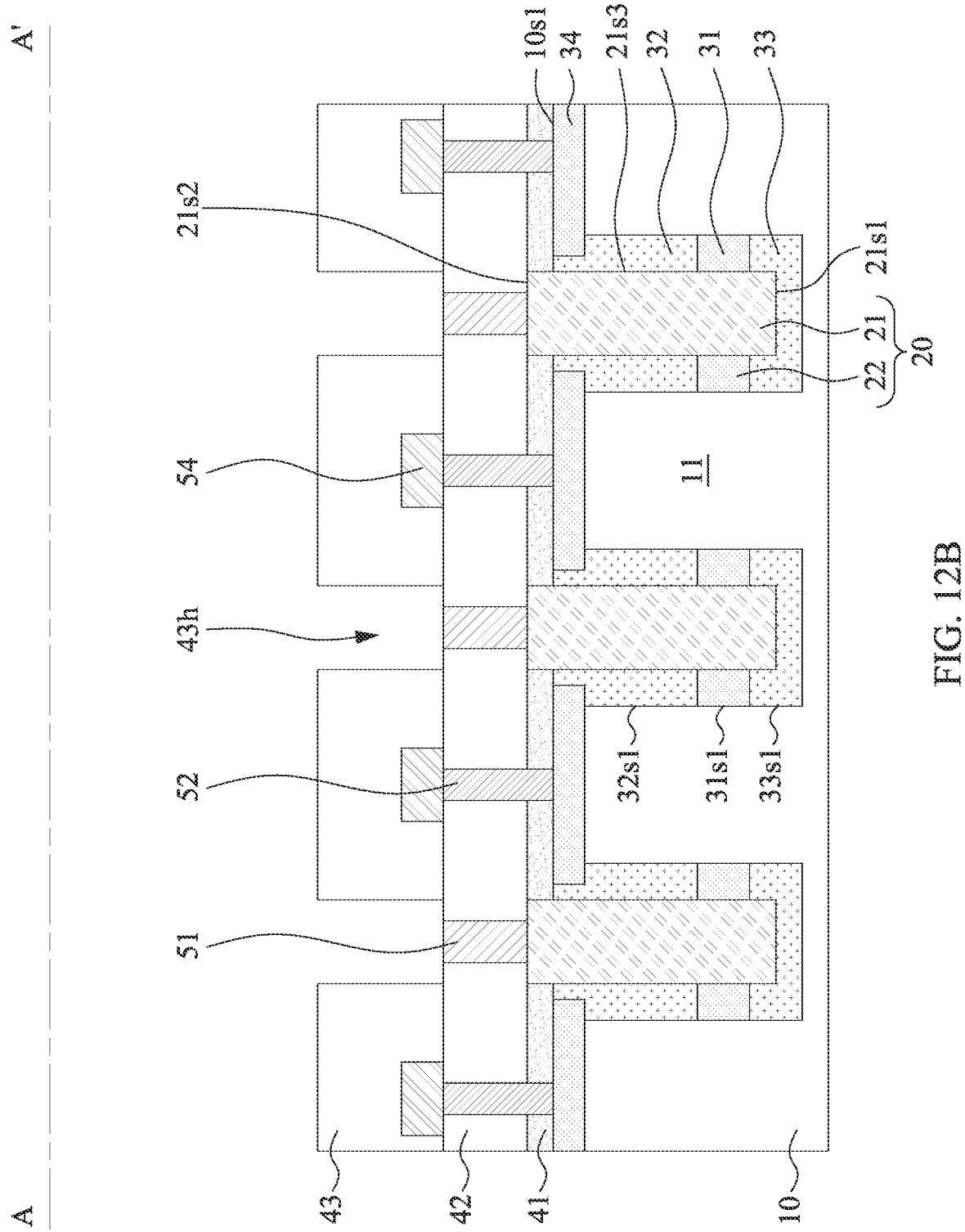
FIG. 12B is a cross-sectional view along line A-A' of FIG. 12A, in accordance with some embodiments of the present disclosure.

As shown in FIG. 12A and FIG. 12B, a dielectric layer 43 may be formed. In some embodiments, the dielectric layer 43 may be formed on the dielectric layer 42. In some embodiments, the dielectric layer 43 may be patterned to form an opening 43h. In some embodiments, the conductive feature 51 may be exposed by the opening 43h. The dielectric layer 43 may be formed by CVD, ALD, PVD, LPCVD, or other suitable processes.

Figure 13A:
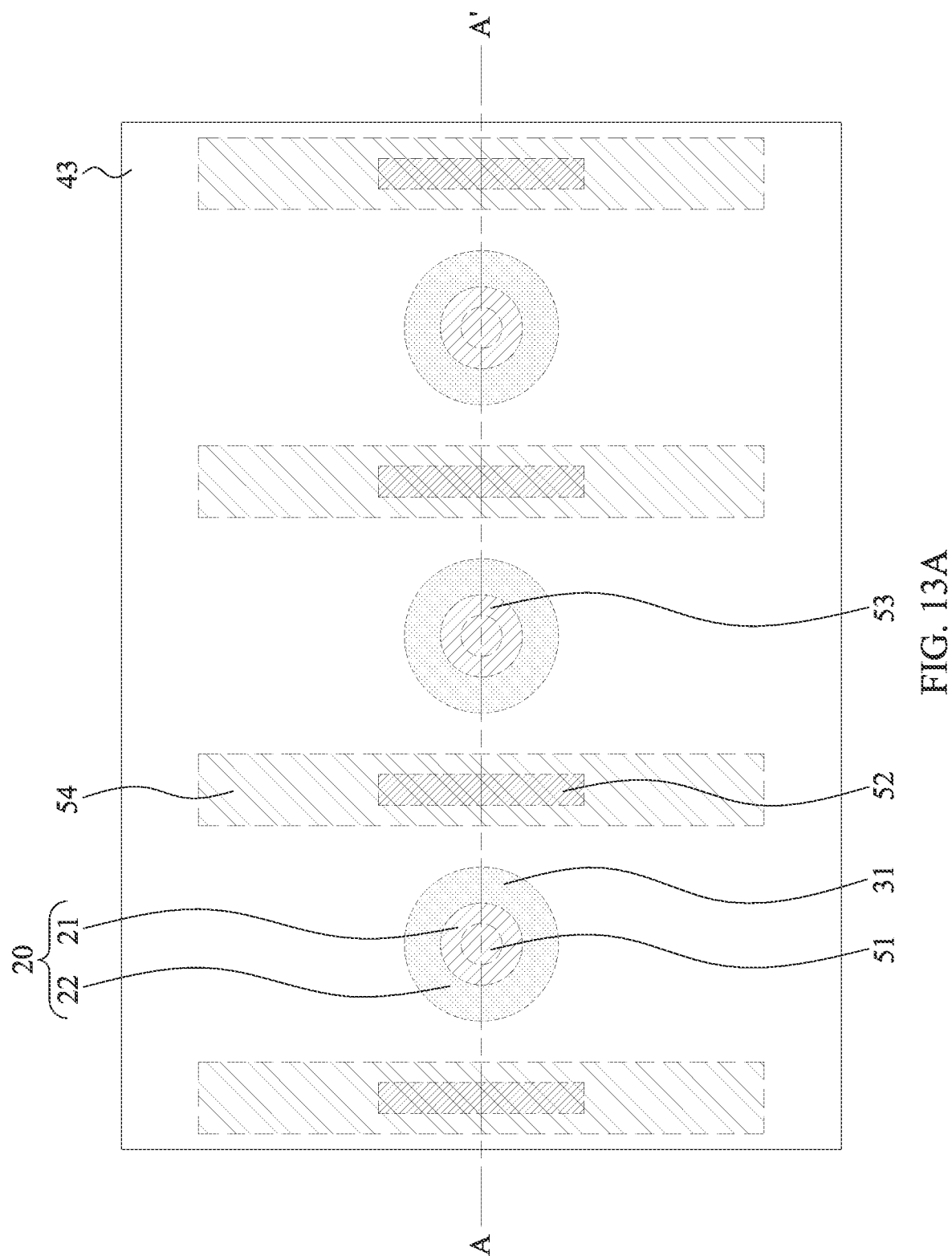
FIG. 13A illustrates one or more stages of an exemplary method for manufacturing a semiconductor device according to some embodiments of the present disclosure.
Figure 13B:
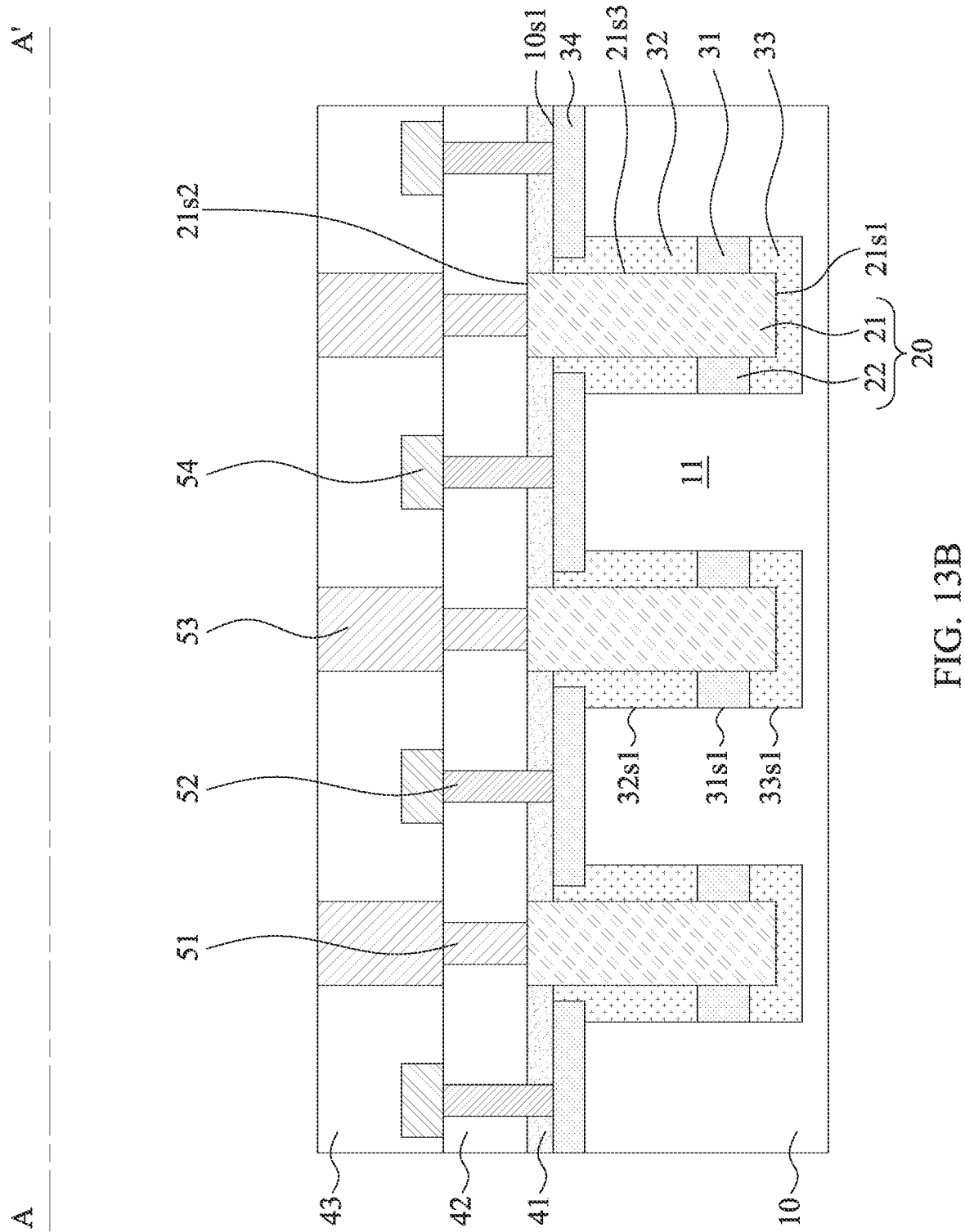
FIG. 13B is a cross-sectional view along line A-A' of FIG. 13A, in accordance with some embodiments of the present disclosure.

As shown in FIG. 13A and FIG. 13B, a conductive feature 53 may be formed. In some embodiments, the conductive feature 53 may be formed within the opening 43h. In some embodiments, the conductive feature 53 may be formed on the conductive feature 51. The conductive feature 53 may be formed by sputtering, PVD, or other suitable processes.

Figure 14A:
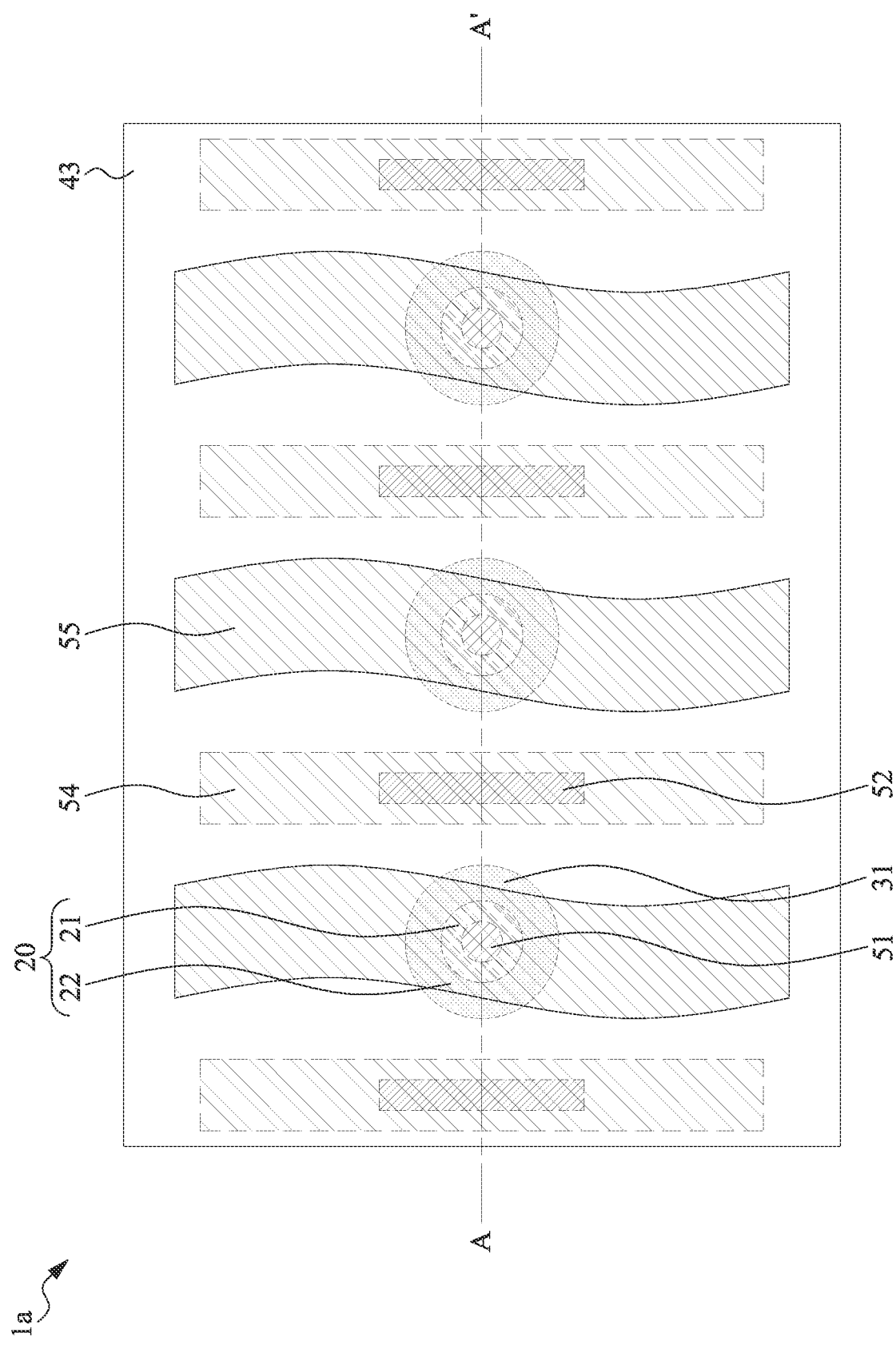
FIG. 14A illustrates one or more stages of an exemplary method for manufacturing a semiconductor device according to some embodiments of the present disclosure.
Figure 14B:
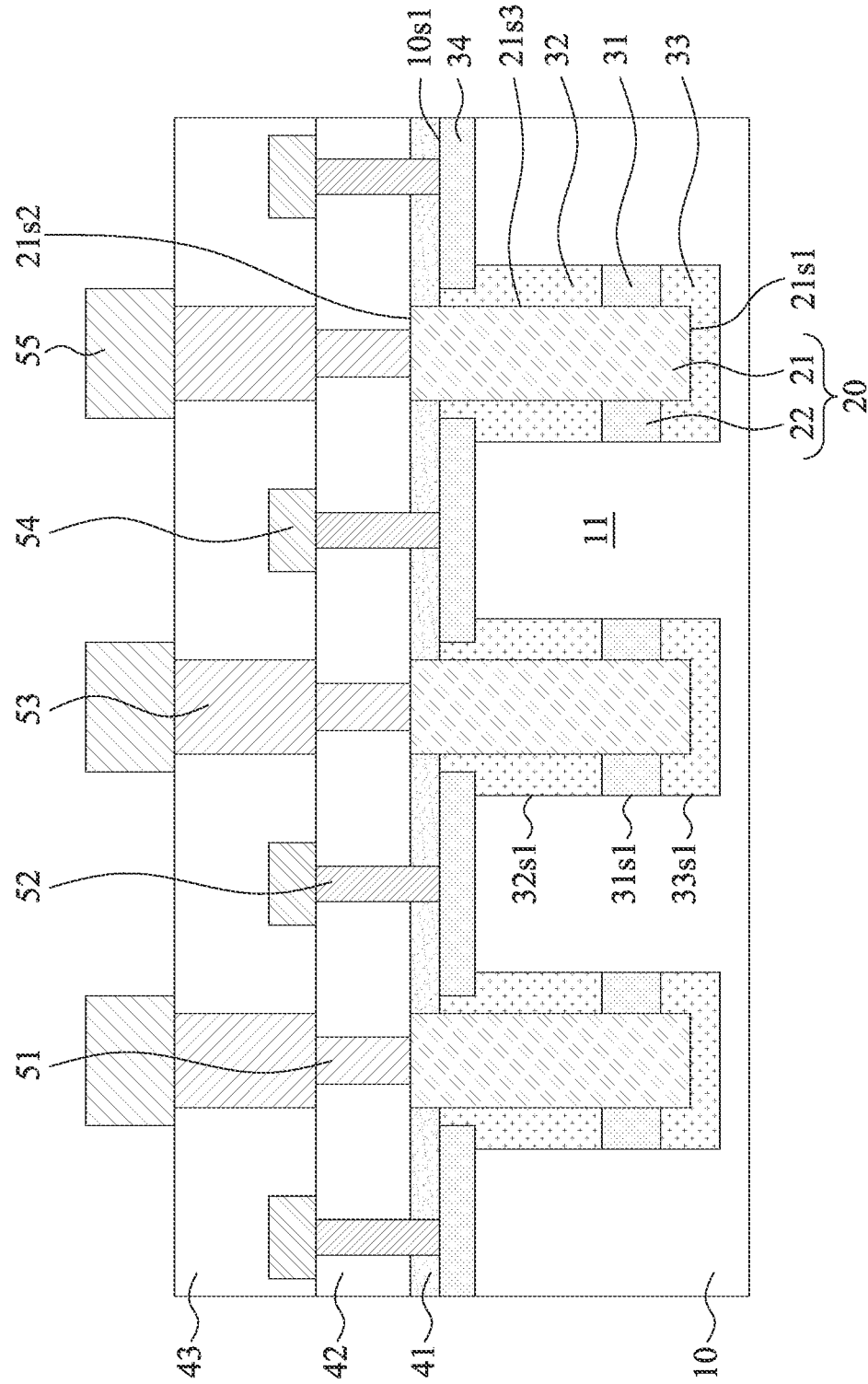
FIG. 14B is a cross-sectional view along line A-A' of FIG. 14A, in accordance with some embodiments of the present disclosure.

As shown in FIG. 14A and FIG. 14B, a conductive feature 55 may be formed, which thereby produces the semiconductor device 1a. In some embodiments, the conductive feature 55 may be formed on the conductive feature 53. The conductive feature 55 may be formed by sputtering, PVD, or other suitable processes.

One aspect of the present disclosure provides a semiconductor device. The semiconductor device includes a substrate, a fuse element, and a fuse medium. The fuse element is disposed within the substrate. The fuse medium surrounds a lateral surface of the fuse element.

Another aspect of the present disclosure provides a semiconductor device. The semiconductor device includes a substrate, a fuse element, and a fuse medium. The fuse element is disposed within the substrate and extends from an upper surface of the substrate. The fuse medium is in contact with the fuse element. The fuse medium is spaced apart from the upper surface of the substrate.

Another aspect of the present disclosure provides a method of manufacturing a semiconductor device. The method includes providing a substrate. The method also includes forming a fuse element within the substrate. The method further includes forming a fuse medium within the substrate, wherein the fuse medium surrounds the fuse element.

The embodiments of the present disclosure provide a fuse structure. The fuse structure may be embedded in a substrate. The fuse structure may include a fuse element and a fuse medium. The fuse medium is made of a semiconductor material with dopants. The semiconductor device may have a relatively small breakdown voltage. Further, the manufacturing process of forming a logic device may be applied to the fuse structure, which benefits the cost of formation of the semiconductor device 1a.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, comprising:
   providing a substrate;
   forming a first doped region within the substrate, wherein an upper surface of the first doped region is spaced apart from an upper surface of the substrate;
   forming a fuse element penetrating an upper surface and a lower surface of the first doped region, wherein the first doped region surrounds a lateral surface of the fuse element; and
   forming a second doped region between the upper surface of the substrate and the first doped region, wherein a first dopant concentration of the first doped region is different from a second dopant concentration of the second doped region.

2. The method of claim 1, wherein the fuse element comprises polysilicon.

3. The method of claim 1, wherein the first dopant concentration is greater than the second dopant concentration.

4. The method of claim 1, wherein the second doped region surrounds the lateral surface of the fuse element.

5. The method of claim 2, further comprising: forming a third doped region below the first doped region, wherein a first dopant concentration of the first doped region is different from a third dopant concentration of the third doped region.

6. The method of claim 5, wherein the first dopant concentration is greater than the third dopant concentration, and the lower surface of the first doped region is spaced apart from a lower surface of the fuse element by the third doped region.

7. The method of claim 5, wherein the third doped region is in contact with a lower surface of the fuse element.

8. The method of claim 2, further comprising: forming a fourth doped region spaced apart from the fuse element, wherein the first doped region is in contact with the fuse element, the fourth doped region extends from an upper surface of the substrate, and the first doped region overlaps the fourth doped region along a first direction perpendicular to the upper surface of the substrate.

* * * * *